United States Patent
Stack et al.

(10) Patent No.: US 10,969,447 B2
(45) Date of Patent: Apr. 6, 2021

(54) FLEXIBLE RADIO FREQUENCY COIL ARRAY WITH DETACHABLE STRAPS FOR MR IMAGING

(71) Applicant: GENERAL ELECTRIC COMPANY, Schenectady, NY (US)

(72) Inventors: Ceara Stack, Ravenna, OH (US); Thomas Grafendorfer, Stanford, CA (US); Fraser Robb, Aurora, OH (US); Steven Falk, Baltimore, MD (US); Yun-Jeong Stickle, Solon, OH (US); Taylan Dalveren, North Ridgeville, OH (US); Guido Kudielka, Munich (DE); Robert Stormont, Hartland, WI (US); Scott Lindsay, Dousman, WI (US); Victor Taracilla, Beachwood, OH (US)

(73) Assignee: General Electric Company, Schenectady, NY (US)

( * ) Notice: Subject to any disclaimer, the term of this patent is extended or adjusted under 35 U.S.C. 154(b) by 34 days.

(21) Appl. No.: 16/196,558

(22) Filed: Nov. 20, 2018

(65) Prior Publication Data

US 2019/0154775 A1   May 23, 2019

Related U.S. Application Data

(60) Provisional application No. 62/590,234, filed on Nov. 22, 2017.

(51) Int. Cl.
*G01R 33/34* (2006.01)
*G01R 33/3415* (2006.01)
(Continued)

(52) U.S. Cl.
CPC . *G01R 33/34084* (2013.01); *G01R 33/34007* (2013.01); *G01R 33/3415* (2013.01);
(Continued)

(58) Field of Classification Search
CPC ......... G01R 33/3415; G01R 33/34007; G01R 33/34084; G01R 33/3685; G01R 33/48; G01R 33/3657
(Continued)

(56) References Cited

U.S. PATENT DOCUMENTS 4,621,237 A * 11/1986 Timms ................ G01R 33/341
                                                            324/318
5,435,302 A *  7/1995 Lenkinski .............. G01R 33/34
                                                            324/318
(Continued)

OTHER PUBLICATIONS

Nature Communications, Article: Screen-Printed Flexible MRI Receive Coils by Joseph R. Corea, et al. published on Mar. 10, 2016.
(Continued)

*Primary Examiner* — Dixomara Vargas
*Assistant Examiner* — Sean Curtis

(57) ABSTRACT

Methods and systems are provided for radio frequency (RF) coil arrays for magnetic resonance imaging (MRI) systems. In an embodiment, a RF coil array assembly for a MRI system includes a compressible body; an upper posterior RF coil array including a first plurality of RF coils embedded in the compressible body; a lower posterior RF coil array including a second plurality of RF coils embedded in the compressible body; and a head and neck RF coil array removably coupled to the upper posterior RF coil array. The head and neck RF coil array includes a third plurality of RF coils embedded in the compressible body, and one or more neck straps configured to fold over a neck of a subject to be imaged by the MRI system.

24 Claims, 21 Drawing Sheets

(51) Int. Cl.
  *G01R 33/36* (2006.01)
  *G01R 33/565* (2006.01)
  *G01R 33/54* (2006.01)
  *G01R 33/56* (2006.01)
  *G01R 33/567* (2006.01)

(52) U.S. Cl.
  CPC ....... *G01R 33/3685* (2013.01); *G01R 33/543* (2013.01); *G01R 33/5601* (2013.01); *G01R 33/565* (2013.01); *G01R 33/5673* (2013.01); *G01R 33/365* (2013.01); *G01R 33/3657* (2013.01)

(58) Field of Classification Search
  USPC .................................................. 324/300–322
  See application file for complete search history.

(56) References Cited

U.S. PATENT DOCUMENTS

| | | | | |
|---|---|---|---|---|
| 5,548,218 A * | 8/1996 | Lu | | G01R 33/34 324/318 |
| 5,865,177 A * | 2/1999 | Segawa | | A61B 5/0555 324/318 |
| 5,905,378 A * | 5/1999 | Giaquinto | | G01R 33/34084 324/318 |
| 6,029,082 A * | 2/2000 | Srinivasan | | G01R 33/34046 324/318 |
| 6,084,411 A * | 7/2000 | Giaquinto | | G01R 33/34084 324/318 |
| 6,141,580 A * | 10/2000 | Hayashi | | G01R 33/34046 600/422 |
| 6,199,233 B1 * | 3/2001 | Kantrowitz | | A61B 6/0421 5/601 |
| 6,577,888 B1 * | 6/2003 | Chan | | A61B 5/0555 324/318 |
| 6,591,128 B1 * | 7/2003 | Wu | | G01R 33/34084 324/318 |
| 6,636,040 B1 * | 10/2003 | Eydelman | | G01R 33/34053 324/318 |
| 6,727,698 B1 * | 4/2004 | Eydelman | | G01R 33/34053 324/318 |
| 6,836,117 B2 * | 12/2004 | Tamura | | G01R 33/3678 324/318 |
| 6,847,210 B1 * | 1/2005 | Eydelman | | G01R 33/341 324/318 |
| 6,980,000 B2 * | 12/2005 | Wong | | G01R 33/34053 324/318 |
| 7,171,254 B2 * | 1/2007 | Vavrek | | G01R 33/341 600/407 |
| 7,282,915 B2 * | 10/2007 | Giaquinto | | G01R 33/3415 324/318 |
| 7,382,132 B1 * | 6/2008 | Mathew | | G01R 33/34084 324/318 |
| 7,519,413 B1 * | 4/2009 | Morris | | A61B 5/0408 600/411 |
| 7,619,416 B2 | 11/2009 | Nordmeyer-Massner et al. | | |
| 8,046,046 B2 * | 10/2011 | Chan | | G01R 33/3415 600/422 |
| 8,244,328 B2 * | 8/2012 | Biber | | H01Q 9/28 600/421 |
| 8,269,498 B2 | 9/2012 | Zhang | | |
| 8,295,430 B2 * | 10/2012 | Zhu | | A61B 6/4417 378/4 |
| 8,441,258 B2 * | 5/2013 | Chan | | G01R 33/3415 324/318 |
| 8,598,880 B2 | 12/2013 | Dalveren et al. | | |
| 8,604,790 B2 * | 12/2013 | Driemel | | G01R 33/36 324/318 |
| D701,961 S * | 4/2014 | Charles | | D24/158 |
| 9,000,766 B2 * | 4/2015 | Chu | | G01R 33/34084 324/318 |
| 9,002,431 B2 * | 4/2015 | Jones | | G01R 33/34007 600/421 |
| 9,285,440 B2 * | 3/2016 | Driemel | | A61B 5/055 |
| 9,575,145 B2 * | 2/2017 | Culver | | G01R 33/34046 |
| 9,678,180 B2 | 6/2017 | Yang et al. | | |
| 9,804,237 B2 | 10/2017 | Driemel | | |
| 10,132,882 B2 * | 11/2018 | Garcia | | G01R 33/34007 |
| 10,184,997 B2 * | 1/2019 | Piferi | | A61B 50/30 |
| 10,413,757 B2 * | 9/2019 | Sato | | G01N 29/28 |
| 10,653,335 B2 * | 5/2020 | Dohata | | A61B 5/0555 |
| 2005/0107686 A1 * | 5/2005 | Chan | | G01R 33/3415 600/422 |
| 2008/0204021 A1 * | 8/2008 | Leussler | | G01R 33/3415 324/318 |
| 2010/0329414 A1 * | 12/2010 | Zhu | | A61B 6/4417 378/4 |
| 2011/0156705 A1 * | 6/2011 | Chan | | G01R 33/3678 324/318 |
| 2013/0076361 A1 * | 3/2013 | Taniguchi | | G01R 33/34092 324/322 |
| 2013/0131497 A1 * | 5/2013 | Linz | | A61G 1/00 600/415 |
| 2015/0011870 A1 * | 1/2015 | Piferi | | G01R 33/34 600/422 |
| 2015/0173678 A1 | 6/2015 | Jones | | |
| 2016/0135711 A1 * | 5/2016 | Dohata | | G01R 33/3664 600/422 |
| 2016/0158082 A1 * | 6/2016 | Gainor | | A61G 7/075 5/690 |
| 2016/0363640 A1 * | 12/2016 | Garcia | | G01R 33/34007 |
| 2018/0329005 A1 * | 11/2018 | Sodickson | | G01R 33/3621 |
| 2018/0372817 A1 * | 12/2018 | Rahmat-Samii | | A61B 5/055 |
| 2019/0107595 A1 * | 4/2019 | Iwadate | | G01R 33/5676 |
| 2019/0154773 A1 * | 5/2019 | Stack | | G01R 33/34084 |
| 2019/0154775 A1 * | 5/2019 | Stack | | G01R 33/34084 |
| 2019/0369176 A1 * | 12/2019 | Dalveren | | G01R 33/34084 |
| 2019/0369180 A1 * | 12/2019 | Chang | | G01R 33/3664 |
| 2019/0377040 A1 * | 12/2019 | Stack | | A61B 5/055 |
| 2020/0158800 A1 * | 5/2020 | Taracila | | A61G 13/121 |

OTHER PUBLICATIONS

High Impedance Detector Arrays for Magnetic Resonance by Bei Zhang, et al. published Sep. 11, 2017.

* cited by examiner

FLEXIBLE RADIO FREQUENCY COIL ARRAY WITH DETACHABLE STRAPS FOR MR IMAGING

CROSS REFERENCE TO RELATED APPLICATIONS

This application claims priority to and the benefit of U.S. Provisional Patent Application Ser. No. 62/590,234, filed on Nov. 22, 2017, which is incorporated herein by reference in its entirety.

FIELD

Embodiments of the subject matter disclosed herein relate to magnetic resonance imaging (MRI), and more particularly, to radio frequency (RF) coil arrays for MRI systems.

BACKGROUND

MRI is a medical imaging modality that can produce images of an interior of a patient without x-ray radiation or other types of ionizing radiation. An MRI system is a medical imaging device utilizing a superconducting magnet to create a strong, uniform, static magnetic field within a designated region (e.g., within a passage shaped to receive a patient). When a body of a patient (or portion of the body of the patient) is positioned within the magnetic field, nuclear spins associated with the hydrogen nuclei that form water within tissues of the patient become polarized. The magnetic moments associated with these spins become aligned along the direction of the magnetic field and result in a small net tissue magnetization in the direction of the magnetic field. MRI systems additionally include magnetic gradient coils that produce spatially-varying magnetic fields of smaller magnitudes relative to a magnitude of the uniform magnetic field resulting from the superconducting magnet. The spatially-varying magnetic fields are configured to be orthogonal to each other in order to spatially encode the region by creating a signature resonance frequency of the hydrogen nuclei at different locations in the body of the patient. RF coil arrays are then used to create pulses of RF energy at or near the resonance frequency of the hydrogen nuclei. The pulses of RF energy are absorbed by the hydrogen nuclei, thereby adding energy to the nuclear spin system and adjusting the hydrogen nuclei from a rest state to an excited state. As the hydrogen nuclei relax back to the rest state from the excited state, they release the absorbed energy in the form of an MR signal. This signal is detected by the RF coil arrays of the MRI system and is transformed into an image using reconstruction algorithms.

As mentioned, RF coil arrays are used in MRI systems to transmit RF excitation signals ("transmit coil"), and to receive the MR signals emitted by an imaging subject ("receive coil"). Coil-interfacing cables may be used to transmit signals between the RF coils of the RF coil arrays and other aspects of the processing system, for example to control the RF coils and/or to receive information from the RF coils. However, conventional RF coils tend to be bulky, rigid, and are configured to be maintained at a fixed position relative to other RF coils in an array. This bulkiness and lack of flexibility often prevents the RF coil loops from coupling most efficiently with the desired anatomy and make them very uncomfortable to the imaging subject. Further, coil-to-coil interactions dictate that the coils be sized and/or positioned non-ideally from a coverage or imaging acceleration perspective.

Accordingly, many traditional RF coil arrays are not designed for imaging small/young patient, e.g., infants and children. In particular, young children and/or infants are often incapable of controlling their movements, and as such, must often be stabilized by a practitioner during an MRI scan. Typically, a practitioner trying to stabilize a young patient during an MRI scan may actually cause the young patient to be moved farther away from the RF coil array than if the patient were to remain still on their own.

BRIEF DESCRIPTION

In an embodiment, a RF coil array assembly for a MRI system is provided. The RF coil array assembly includes a compressible body; an upper posterior RF coil array including a first plurality of RF coils embedded in the compressible body; a lower posterior RF coil array including a second plurality of RF coils embedded in the compressible body; and a head and neck RF coil array removably coupled to the upper posterior RF coil array. The head and neck RF coil array includes a third plurality of RF coils embedded in the compressible body, and one or more neck straps configured to fold over a neck of a subject to be imaged by the MRI system. Each RF coil of the first plurality of RF coils, the second plurality of RF coils, and the third plurality of RF coils includes a distributed capacitance loop portion having two distributed capacitance wire conductors.

In another embodiment, a pad for a MRI system is provided. The pad includes: a compressible base layer configured to support a body of a subject to be imaged by the MRI system; a deformable head support on the base layer configured to confine a head of the subject; and a RF coil array embedded within the base layer and configured to detect magnetic resonance (MR) signals of the subject. Each RF coil in the RF coil array includes two distributed capacitance wire conductors, wherein the RF coil array adapts its shape according to a load of the subject.

In yet another embodiment, a pad for a MRI system is provided. The pad includes: a compressible body including a central portion and two side portions each extending from the central portion at an angle; and a RF coil array embedded in the central portion and configured to detect MR signals of a subject to be imaged by the MRI system. Each RF coil in the RF coil array includes two distributed capacitance wire conductors, wherein the RF coil array adapts its shape according to a load of the subject.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 4A:
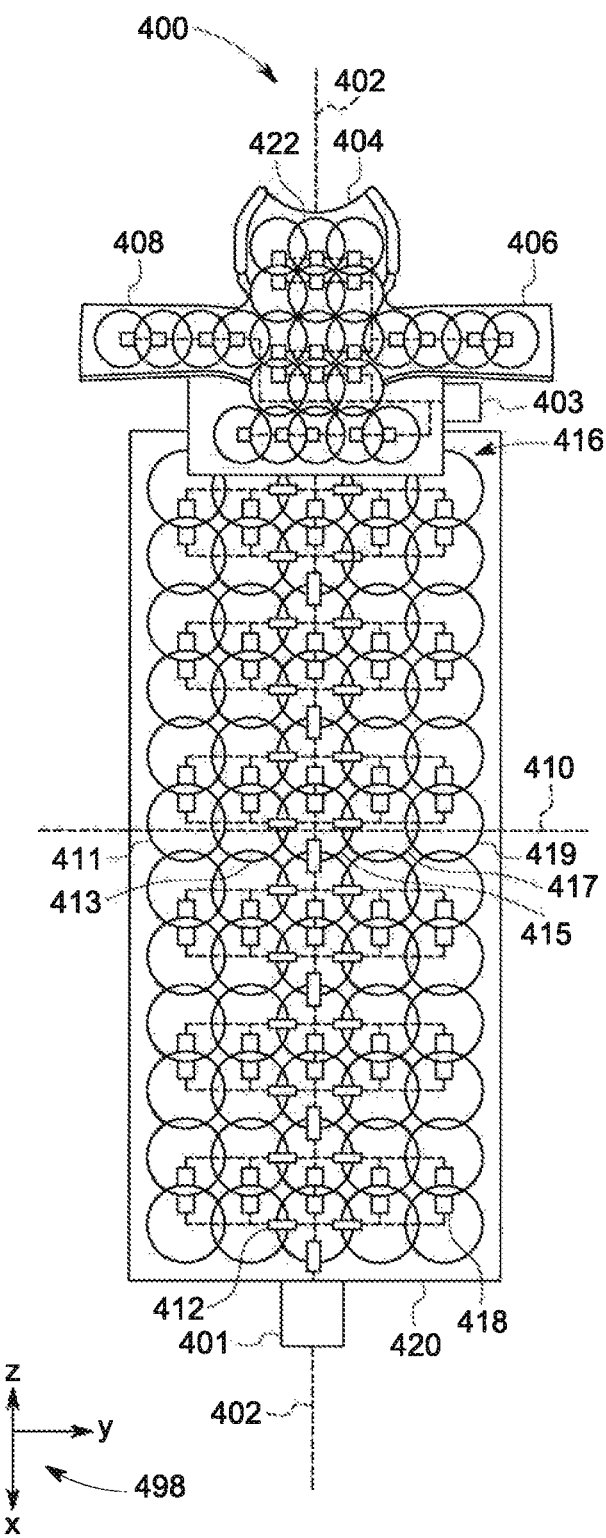
FIGS. 4A-4B each show different RF coil arrangements for posterior RF coil arrays and head and neck RF coil arrays for the MRI system of FIG. 1, in accordance with exemplary embodiments.
Figure 4B:
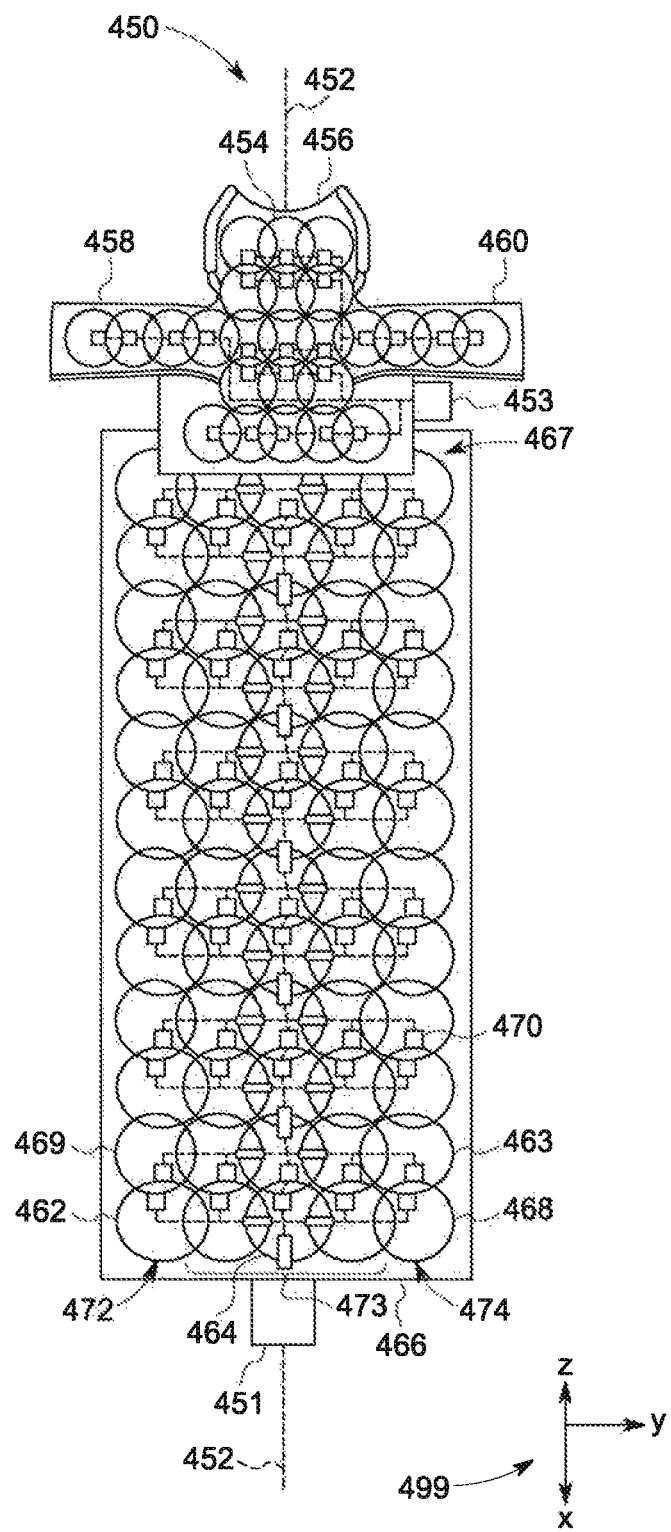
Figure 5:
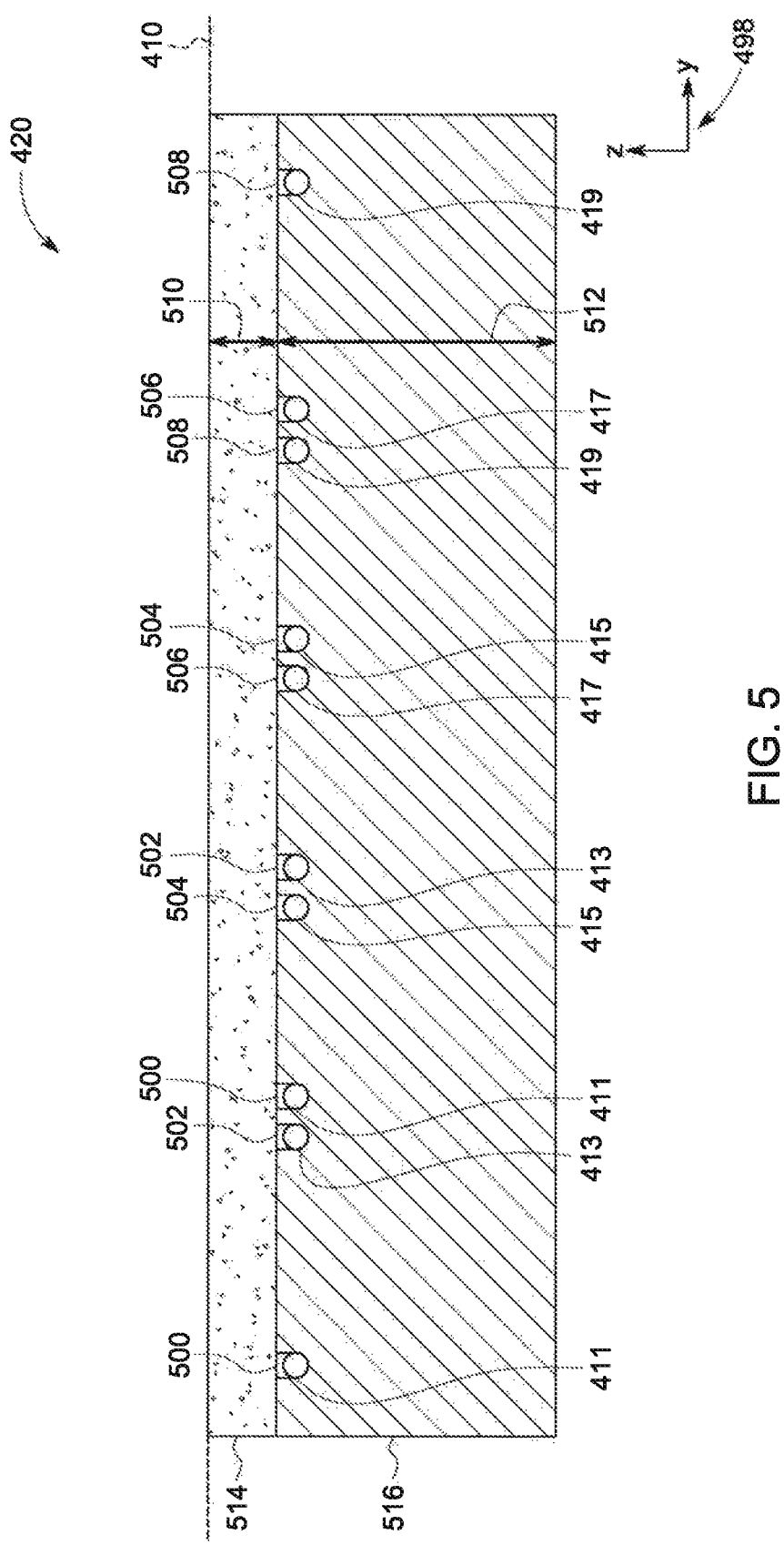
FIG. 5 shows a cross-sectional view of the posterior RF coil array of FIG. 4A, in accordance with an exemplary embodiment.

The following description relates to various embodiments of MRI. In particular, systems and methods are provided for a RF coil array for an MRI system. An MRI system, such as the MRI system shown by FIG. 1, includes a bore with an imaging space positioned therein. The MRI system may include a posterior RF coil array and a head and neck RF coil array, as shown by FIG. 2. The posterior RF coil array and head and neck RF coil array are shaped to support a body of a patient imaged by the MRI system. In some examples, the head and neck RF coil array may include a plurality of straps (as shown by FIGS. 3A-3C and FIG. 7), with the straps shaped to encircle the neck of the patient. The posterior RF coil array and head and neck RF coil array include a plurality of flexible RF coils, as shown by FIGS. 4A-4B, with each RF coil including a loop portion and coupling electronics configured to interface with an electronic controller, as shown schematically by FIG. 6 and FIGS. 9-14. The RF coils are embedded within the posterior RF coil array and head and neck RF coil array proximate to outer surfaces of each RF coil array configured to be positioned against the body of the patient, as shown by FIG. 5. In some examples, such as the example shown by FIG. 7, the posterior RF coil array may additionally include a plurality of straps shaped to encircle one or more sections of the torso, pelvis, and/or limbs of the patient. In some examples, the posterior RF coil array may additionally include one or more RF coils having a different resonant frequency than other RF coils of the RF coil array and configured to detect a respiratory motion of the patient, as shown schematically by FIG. 8.

MR imaging of the cervical spine or neck of a patient may provide valuable diagnostic information for a wide range of different medical conditions. For example, MR contrast imaging of soft tissue may help to detect and monitor a variety of pathologies, misalignments, and/or injuries of the patient, and may assist in detecting certain chronic diseases of the nervous system. MRI may be useful in evaluating patient symptoms such as pain, foreign body sensations, numbness, tingling, and/or weakness in the arms, shoulder, and/or neck area.

However, MR image quality in the neck or cervical spine regions of many patients is often degraded by distortions in the magnetic field produced by the MRI system (e.g., distortions of the BO, or uniform, magnetic field). The distortions of the BO field often arise from tissue interfaces with different susceptibilities to magnetic polarization in the regions of the neck and cervical spine. The low homogeneity of the BO magnetic field in these regions increases the difficulty of imaging these regions via MRI. Further, the signal-to-noise ratio (SNR) of the RF coils positioned at the regions of the neck and cervical spine may be decreased relative to an SNR of RF coils positioned at the head of the patient due to an increased distance of the neck and cervical spine from the RF coils. For example, a curvature of the neck and cervical spine may be different for different patients. As a result, an RF coil array shaped to conform closely to the curvature of the neck and cervical spine of a first patient may conform poorly to the neck and cervical spine of a second patient, decreasing the SNR of the RF coils during imaging of the second patient. The decreased SNR may be particularly noticeable during conditions in which a field strength (e.g., magnitude) of the BO field is three (3) Tesla or greater.

High density phased-array RF coils configured to be positioned at the head and posterior regions of the patient are often coupled to a thin, rigid plastic former to increase an SNR of signals transmitted by the RF coils. In some examples, patient comfort pads may be positioned between the body of the patient and the plastic former in order to increase patient comfort. However, a thickness of the patient comfort pads often exceeds three (3) centimeters and increases a distance between the body of the patient and the RF coils. The increased distance of the RF coils from the body (e.g., 3.5 centimeters) reduces the SNR of the RF coils.

As described herein with regard to the present disclosure, a posterior RF coil array and head and neck RF coil array including flexible, embedded RF coils may increase the SNR of the RF coils by reducing the distance between the coils and the body of the patient. In one example, phased-array RF coils may be coupled to a thin, flexible sheet of material (e.g., a meta-aramid polymer, such as poly (m-phenylenediamine isophthalamide)), and the flexible sheet and RF coils may be embedded together in one or more layers of foam (e.g., expanded polypropylene, viscoelastic polyurethane foam, etc.) shaped to support the body of the patient. In some examples, the distance between the body of the patient and the RF coils may be reduced to approximately one-point-five (1.5) centimeters, and the SNR of the RF coils may be increased by approximately 25% (e.g., relative to RF coils coupled to a plastic former as described above). Additionally, a weight of the coil arrays may be reduced, increasing an ease with which the posterior RF coil array and head and neck RF coil array may be repositioned relative to the MRI system (e.g., on a table of the MRI system), and the increased SNR may enable imaging applications that rely on fast parallel imaging techniques (e.g., Compressed Sensing and Hyperband) to be performed with increased reliability and/or precision.

Configuring the pads and embedded RF coils in this way may reduce BO distortion and improve SNR, resulting in increased quality (e.g., contrast and/or detail) of images produced by the MRI system. The increased quality of each image may enable an operator of the MRI system (e.g., a technician) to image the desired regions of the patient with a decreased number of scans, thereby decreasing an examination time of the patient, increasing patient comfort, and increasing an efficiency of the MRI system (e.g., number of patients scanned per day).

Figure 1:
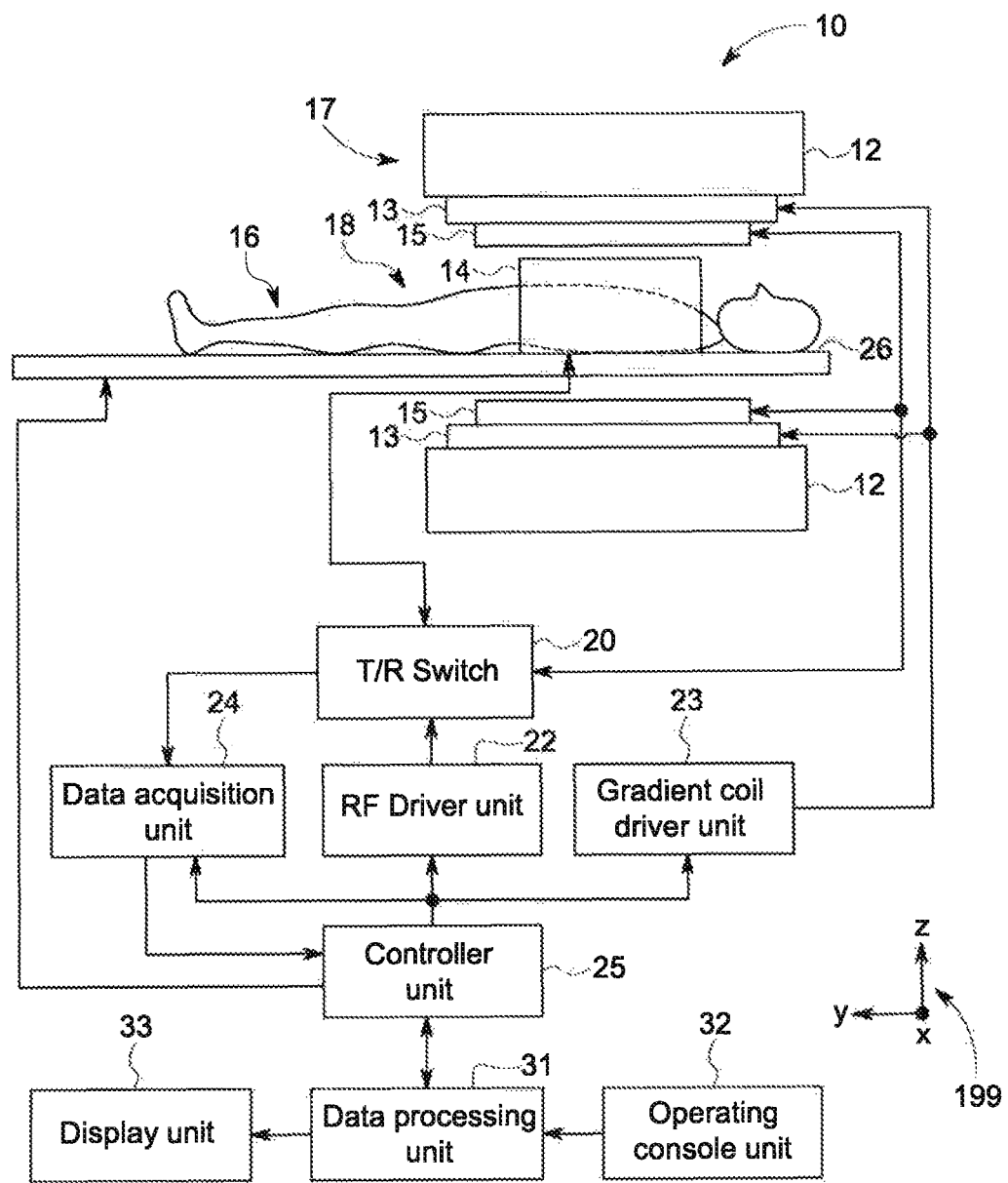
FIG. 1 is a block diagram of an MRI system, in accordance with an exemplary embodiment.
Figure 2:
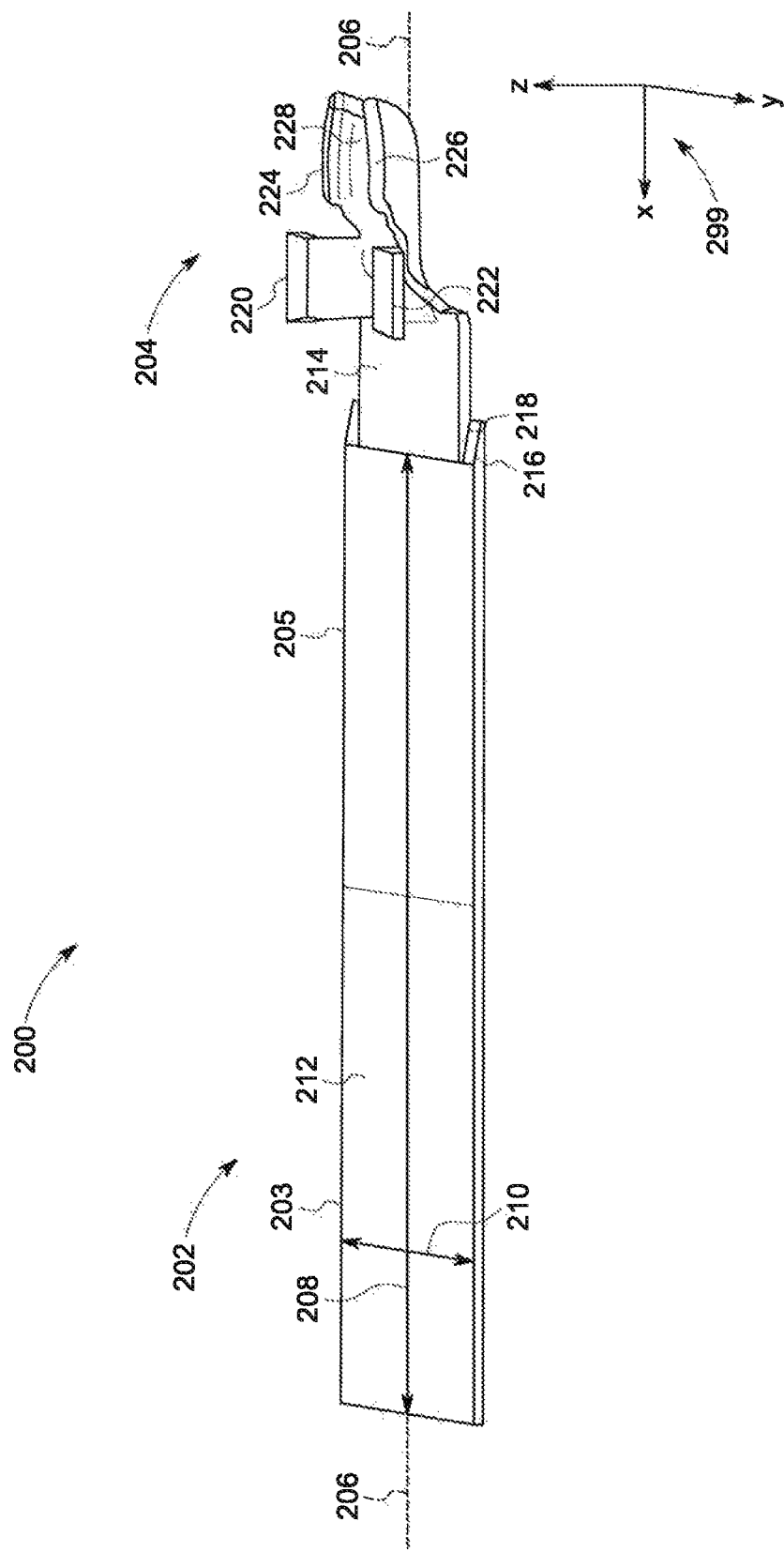
FIG. 2 shows a posterior RF coil array and a head and neck RF coil array for the MRI system of FIG. 1, in accordance with an exemplary embodiment.

Referring now to FIG. 1, a magnetic resonance imaging (MRI) apparatus 10 in accordance with embodiments of the present invention is shown. The MRI apparatus 10 includes a superconducting magnet unit 12, a gradient coil unit 13, an RF coil unit 14, an RF body or volume coil unit 15, a transmit/receive (T/R) switch 20, an RF driver unit 22, a gradient coil driver unit 23, a data acquisition unit 24, a controller unit 25, a patient table or bed 26, a data processing unit 31, an operating console unit 32, and a display unit 33. In one example, the RF coil unit 14 is a surface coil, which is a local coil that is typically placed proximate to the anatomy of interest of a subject 16 (e.g., a patient). Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are independent but electromagnetically coupled structures. The MRI apparatus 10 transmits electromagnetic pulse signals to the subject 16 placed in an imaging space 18 with a static magnetic field formed to perform a scan for obtaining magnetic resonance signals from the subject 16 to reconstruct an image of a slice of the subject 16 based on the magnetic resonance signals thus obtained by the scan.

The superconducting magnet unit 12 includes, for example, an annular superconducting magnet, which is mounted within a toroidal vacuum vessel. The magnet defines a cylindrical space surrounding the subject 16, and generates a constant, strong, uniform, static magnetic along the Z direction of the cylindrical space.

The MRI apparatus 10 also includes the gradient coil unit 13 that generates a gradient magnetic field in the imaging space 18 so as to provide the magnetic resonance signals received by the RF coil unit 14 with three-dimensional positional information. The gradient coil unit 13 includes three gradient coil systems, each of which generates a gradient magnetic field, which inclines into one of three spatial axes perpendicular to each other, and generates a gradient magnetic field in each of frequency encoding direction, phase encoding direction, and slice selection direction in accordance with the imaging condition. More specifically, the gradient coil unit 13 applies a gradient magnetic field in the slice selection direction of the subject 16, to select the slice; and the RF body coil unit 15 transmits an RF signal to a selected slice of the subject 16 and excites it. The gradient coil unit 13 also applies a gradient field in the phase encoding direction of the subject 16 to phase encode the magnetic resonance signals from the slice excited by the RF signal. The gradient coil unit 13 then applies a gradient magnetic field in the frequency encoding direction of the subject 16 to frequency encode the magnetic resonance signals from the slice excited by the RF signal.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field is formed by the superconducting magnet unit 12, the RF coil unit 15 transmits, based on a control signal from the controller unit 25, an RF pulse that is an electromagnet wave to the subject 16 and thereby generates a high-frequency magnetic field. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

The RF body coil unit 15 is disposed, for example, to enclose the imaging space 18, and produces RF magnetic field pulses orthogonal to the main magnetic field produced by the superconducting magnet unit 12 within the imaging space 18 to excite the nuclei. In contrast to the RF coil unit 14, which may be disconnected from the MR apparatus 10 and replaced with another RF coil unit, the RF body coil unit 15 is fixedly attached and connected to the MRI apparatus 10. Furthermore, whereas local coils such as those including the RF coil unit 14 can transmit to or receive signals from only a localized region of the subject 16, the RF body coil unit 15 generally have a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode, a receive-only mode, or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coil unit 15 and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may include, for example, a ROM, flexible disk, hard disk, optical disk, magneto-optical disk, CD-ROM, or non-volatile memory. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a touchscreen, keyboard, and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image or three-dimensional (3D) image of the subject 16 generated by the data processing unit 31.

During a scan, RF coil array interfacing cables may be used to transmit signals between the RF coils (e.g., RF coil unit 14 and RF body coil unit 15) and other aspects of the processing system (e.g., data acquisition unit 24, controller unit 25, and so on), for example to control the RF coils and/or to receive information from the RF coils. As explained previously, the RF body coil unit 15 is a transmit coil that transmits RF signals, and the local surface RF coil unit 14 receives the MR signals. More generally, RF coils are used to transmit RF excitation signals ("transmit coil"), and to receive the MR signals emitted by an imaging subject ("receive coil"). In an example, the transmit and receive coils are a single mechanical and electrical structure or array of structures, with transmit/receive mode switchable by auxiliary circuitry. In other examples, the transmit body coil (e.g., RF body coil unit 15) and the surface receive coil (e.g., RF coil unit 14) may be independent structures that are physically coupled to each other via a data acquisition unit or other processing unit. For enhanced image quality, however, it may be desirable to provide a receive coil that is mechanically and electrically isolated from the transmit coil. In such case it is desirable that the receive coil, in its receive mode, be electromagnetically coupled to and resonant with an RF "echo" that is stimulated by the transmit coil. However, during transmit mode, it may be desirable that the receive coil is electromagnetically decoupled from and therefore not resonant with the transmit coil, during actual transmission of the RF signal. Such decoupling decreases a likelihood of noise being produced within the auxiliary circuitry when the receive coil couples to the full power of the RF signal. Additional details regarding the uncoupling of the receive RF coil will be described below.

Traditional RF coils may include acid etched copper traces (loops) on printed circuit boards (PCBs) with lumped electronic components (e.g., capacitors, inductors, baluns, resistors, etc.), matching circuitry, decoupling circuitry, and pre-amplifiers. Such a configuration is typically very bulky, heavy, and rigid, and requires relatively strict placement of the coils relative to each other in an array to prevent coupling interactions among coil elements that may degrade image quality. As such, traditional RF coils and RF coil arrays lack flexibility and hence may not conform to patient anatomy, degrading imaging quality and patient comfort.

Thus, according to embodiments disclosed herein, an RF coil array, such as RF coil unit 14, may include distributed capacitance wires rather than copper traces on PCBs with lumped electronic components. As a result, the RF coil array may be lightweight and flexible, allowing placement in low cost, lightweight, waterproof, and/or flame retardant fabrics or materials. The coupling electronics portion coupling the loop portion of the RF coil (e.g., the distributed capacitance wire) may be miniaturized and utilize a low input impedance pre-amplifier, which is optimized for high source impedance (e.g., due to impedance matching circuitry) and allows flexible overlaps among coil elements in an RF coil array. Further, the RF coil array interfacing cable between the RF coil array and system processing components may be flexible and include integrated transparency functionality in the form of distributed baluns, which allows rigid electronic components to be avoided and aids in spreading of the heat load.

FIG. 2 shows an example RF coil assembly 200. RF coil assembly 200 may include a plurality of RF coils, which may be non-limiting examples of RF coils included by RF coil unit 14 of FIG. 1. As such, RF coil assembly 200 may be configured to be positioned in a bore of an MRI system, such as within imaging space 18 of MRI system 10 of FIG. 1, in order to receive MR signals produced by a subject to be imaged by the MRI system (e.g., a patient). The MR signals are then sent to a processing system (e.g., data acquisition unit 24 and/or controller unit 25 shown by FIG. 1 and described above) and used to generate one or more images of the subject. A set of reference axes 299 is illustrated in FIG. 2, in order to provide positional reference for the elements shown in FIG. 2 as well as additional figures, and the reference axes 299 may be similar to reference axes 199 shown by FIG. 1 (e.g., having a same relative arrangement of axes).

RF coil assembly 200 includes a posterior RF coil array 202 coupled to a head and neck RF coil array 204. Each of posterior RF coil array 202 and head and neck RF coil array 204 is configured to be positioned on a table of an MRI system (e.g., table 26 of FIG. 1) and support the subject to be imaged (e.g., the patient). Each of posterior RF coil array 202 and head and neck RF coil array 204 includes a plurality of RF coils, as illustrated and explained in more detail below.

Referring first to posterior RF coil array 202, posterior RF coil array 202 may include two sections. Specifically, posterior RF coil array 202 may include a lower posterior RF coil array 203 (e.g., a first section of the posterior RF coil array 202) and an upper posterior RF coil array 205 (e.g., a second section of the posterior RF coil array 202). Lower posterior RF coil array 203 and upper posterior RF coil array 205 may each include one or more layers of one or more flexible, compressible materials with a plurality of RF coils embedded therein. In one example, the lower posterior RF coil array 203 and upper posterior RF coil array 205 may each include a first layer formed of a flexible fabric material (e.g., DARTEX® fabric) and a second layer formed of a memory foam material (e.g., viscoelastic polyurethane foam). Due to the compressible nature of the material forming the posterior RF coil array 202, lower posterior RF coil array 203 and upper posterior RF coil array 205 may conform to a shape of the subject when the subject is positioned on the posterior RF coil array 202. Lower posterior RF coil array 203 and upper posterior RF coil array 205 may be removably coupled to each other, or lower posterior RF coil array 203 and upper posterior RF coil array 205 may be fixedly coupled to each other. In some examples, lower posterior RF coil array 203 and upper posterior RF coil array 205 may be continuous (e.g., formed of/from the same flexible, compressible pad).

Posterior RF coil array 202 may have a length 208 that extends from an upper edge of upper posterior RF coil array 205 (e.g., an edge closer to the head and neck RF coil array 204 during conditions in which the head and neck RF coil array 204 is coupled to the posterior RF coil array 202) to a lower edge of lower posterior RF coil array 203 along a longitudinal, central axis 206 of RF coil assembly 200 (which in the view shown in FIG. 2 may be parallel to the x-axis of reference axes 299). Length 208 may be a suitable length that allows RF coil coverage along an entirety of the subject's spine. For example, posterior RF coil array may have a length 208 that extends from the subject's shoulders to past the subject's pelvic region. In one example, length 208 may be 1.13 meters or other suitable length.

Posterior RF coil array 202 may have a width 210 that extends from a first side edge of posterior RF coil array 202 to a second side edge of posterior RF coil array 202 (e.g., in a direction of the y-axis of reference axes 299). Width 210 may be a suitable width that allows for RF coil coverage along an entirety of a width of the subject being imaged. In an example, width 210 may be matched to the width of the table on which RF coil assembly 200 is positioned. In other examples, other widths are possible (e.g., 0.465 meters).

Each of lower posterior RF coil array 203 and upper posterior RF coil array 205 may have an outer surface 212 (which may be referred to herein as a top, first outer surface). Outer surface 212 may be formed of/from the flexible fabric material described above. Outer surface 212 may thus be shaped to support various portions of the subject. For example, the outer surface of lower RF coil array 203 may be shaped to support a lower section of the subject, such as the lower back, pelvic region, and/or legs of the subject. The outer surface of upper RF coil array 205 may be shaped to support an upper section of the subject, such as the upper back, shoulders, and/or arms of the subject. Each of the lower posterior RF coil array 203 and upper posterior RF coil array include a bottom, second outer surface positioned opposite to the outer surface 212 (and opposite to the subject during conditions in which the subject is positioned against the outer surface 212).

Referring now to head and neck RF coil array 204, head and neck RF coil array 204 may include one or more layers of one or more flexible, compressible materials shaped to support a head and neck of the subject and including a plurality of RF coils embedded therein. In one example, the head and neck RF coil array 204 may include a similar configuration of materials as the posterior RF coil array 202 (e.g., a first layer of flexible fabric material such as DARTEX® fabric, and a second layer of memory foam material). Additional details regarding the RF coils embedded in the head and neck RF coil array will be described in more detail below.

Head and neck RF coil array 204 may include a head support section, an upper back support section, and two straps. The straps may extend outward from the head support section and be configured to fold over the subject, such that the straps cover the anterior portion of the neck of the patient in an overlapping fashion. Each of the head support section, upper back support section, and the straps may include a plurality of RF coils.

Thus, as shown in FIG. 2, head and neck RF coil array 202 includes an upper back support 214. Upper back support 214 may be formed of/from the same flexible, compressible material as posterior RF coil array 202, and may be removably coupled to posterior RF coil array 202. For example, as shown in FIG. 2, upper posterior RF coil array 205 may include an angled surface 216 joined to the outer surface of the upper posterior RF coil array 205 and angled relative to the outer surface (e.g., outer surface 212). The angled surface 216 of the upper posterior RF coil array 205 slopes downward relative to the outer surface (e.g., topmost surface) of the upper posterior RF coil array 205 in a direction away from the outer surface. Specifically, as shown by FIG. 2, the angled surface 216 extends away from the outer surface of the upper posterior RF coil array 205 in a negative direction of the x-axis of reference axes 299 (e.g., in an axial direction of central axis 206), and is angled relative to the outer surface in a negative direction of the z-axis of reference axes 299 (e.g., declines from the top outer surface to a bottom surface of upper posterior RF coil array 205, where the bottom surface is configured to interface with/couple to the table of the MRI system, and where the top outer surface is configured to be positioned in face-sharing contact with the subject). Face-sharing contact, as referred to herein, may include surfaces (e.g., faces) being positioned in direct, nearly-continuous contact with each other.

Upper back support 214 includes a counterpart angled surface 218 shaped to be positioned in face-sharing contact with the angled surface 216 during conditions in which the head and neck RF coil array 204 is coupled to the posterior RF coil array 202. Specifically, the counterpart angled surface 218 is shaped to slope between a top surface of the upper back support 214 and a bottom surface of the upper back support 214, with the top surface configured to be in face-sharing contact with the subject and the bottom surface being configured to be in face-sharing contact with the table of the MRI system. The counterpart angled surface 218 slopes downward (e.g., vertically toward the table of the MRI system during conditions in which the head and neck RF coil array 204 is positioned on the table) from the edge of the upper back support 214 formed by the top surface, toward the bottom surface of the upper back support 214. The angled surface 216 and counterpart angled surface 218 may be parallel to each other such that the upper posterior RF coil array 205 and upper back support 214 engage in a complementary manner during conditions in which the angled surface 216 and counterpart angled surface 218 are positioned against each other (e.g., the posterior RF coil array 202 is coupled to the head and neck RF coil array 204). While not shown in FIG. 2, fastening mechanisms may be present to further couple the posterior RF coil array 202 to the head and neck RF coil array 204, such as clips, hook and loop fasteners, or other fasteners. Further, other types of engaging surfaces (e.g., other than the tapering surfaces) between upper posterior RF coil array 205 and upper back support 214 are possible. In still further examples, upper posterior RF coil array 205 and upper back support 214 may be fixedly connected and/or formed of/from a unitary piece of material.

Upper back support 214 may have an outer surface (e.g., the top surface) that is substantially flat and rectangular, and that is configured to conform to an upper back of the subject to be imaged (e.g., in the region of the shoulders/lower neck). In some examples, a width of upper back support 214 may be the same as width 210 described above (e.g., in the direction of the y-axis of reference axes 299). In the example shown in FIG. 2, a width of upper back support 214 is less than width 210. Additionally, a thickness of upper back support 214 may be equal to a thickness of posterior RF coil array 202 (e.g., in the direction of the z-axis of reference axes 299).

Upper back support 214 is coupled to head support 228. Head support 228 may be configured to extend in the axial direction of central axis 206 (e.g., the direction of the x-axis of reference axes 299) in order to follow a curvature of the spine of the subject in the neck region. Head support 228 may include a first sidewall 224 and a second sidewall 226. Each of first sidewall 224 and second sidewall 226 may curve upward (e.g., in an upward, vertical direction relative to the table of the MRI system during conditions in which the head and neck RF coil array 204 is positioned on the table, with the bottom surface of the upper back support 214 against the table) from a bottom of head support 228 at central axis 206, and may each be intersected by a same axis perpendicular to the central axis 206 (e.g., an axis similar to perpendicular axis 300 shown in FIGS. 3A-3C and described in more detail below). Accordingly, head support 228 may be shaped to conform to a head of the subject, and each sidewall may extend around the head from a bottom of the head to a suitable region along a respective side of the head (e.g., beyond the ears, between the ears and the cheeks, or other suitable location).

In a region where upper back support 214 couples to head support 228, a first strap 220 and a second strap 222 may extend outward from head support 228. The first and second straps may be flexible to enable the straps to be folded over each other on top of the neck of the subject.

Thus, FIG. 2 illustrates an RF coil assembly having three portions—a lower posterior RF coil array, an upper posterior RF coil array, and a head and neck RF coil array. Each portion may be removably coupled from each other to allow for easy transport and installation of the RF coil assembly. The RF coil assembly may be configured to be positioned on a table of an MRI system, and a subject to be imaged may be positioned on top of the RF coil assembly. In this configuration, imaging of a posterior side of the subject is enabled, from the head of the subject to at least the pelvic region of the subject (and in some examples, the entirety of the posterior side of the subject). Each portion of the RF coil assembly may be formed from/of one or more flexible, compressible materials, as described above, with a plurality of RF coils embedded in or otherwise coupled to the compressible material. Additional details regarding the shape of the head and neck RF coil array, the configuration of the RF coils within the RF coil assembly, and the material forming the RF coil assembly will be discussed in more detail below.

Figure 3A:
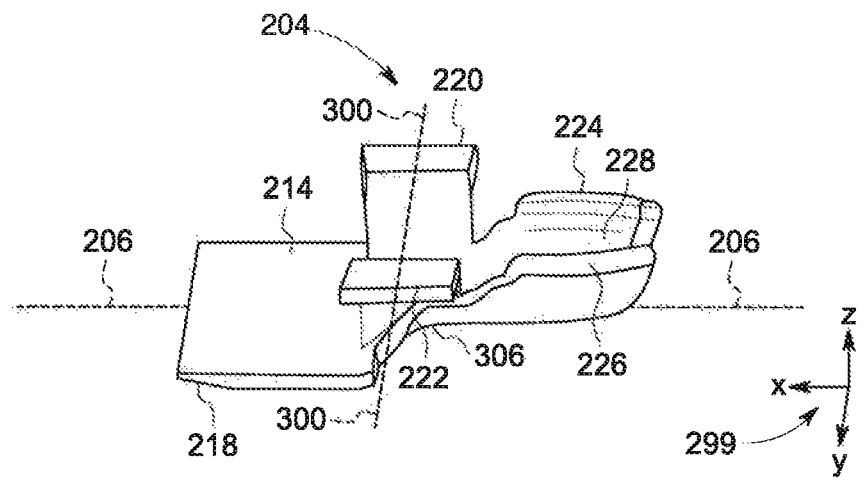
FIGS. 3A-3C each show different perspective views of the head and neck RF coil array of FIG. 2, in accordance with an exemplary embodiment.
Figure 3B:
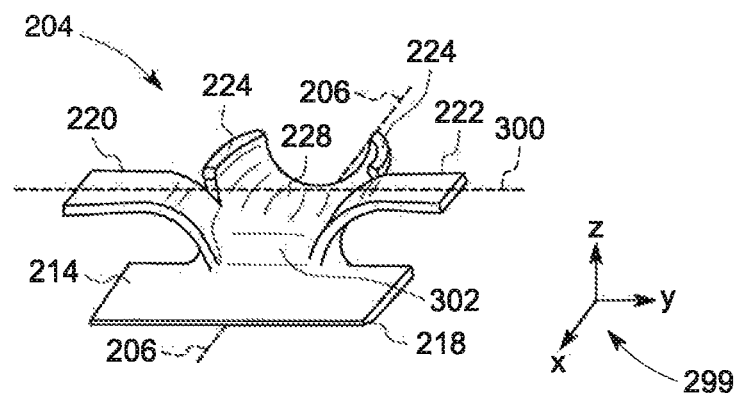
Figure 3C:
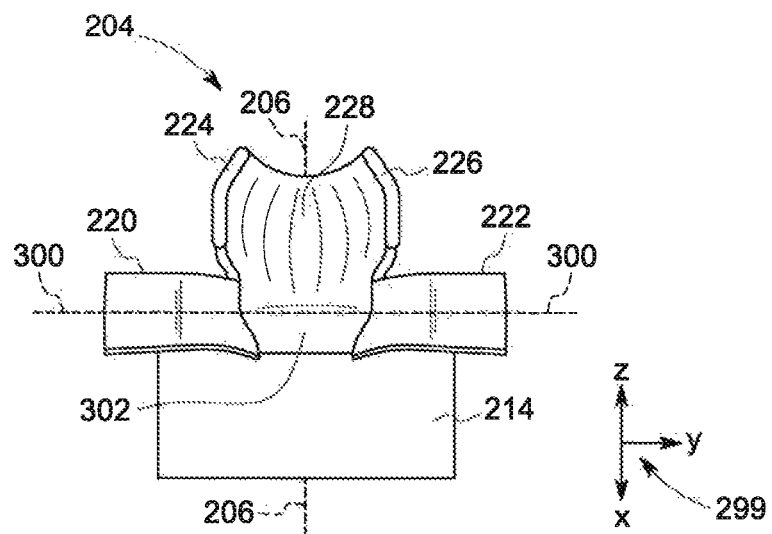

FIGS. 3A-3C illustrate various views of head and neck RF coil array 204. FIG. 3A shows a first side perspective view, FIG. 3B shows a second side perspective view, and FIG. 3C shows a top-down view of head and neck RF coil array 204. Reference axes 299 are present in each of FIGS. 3A-3C for comparison of the views shown. Components similar to those described above with respect to FIG. 2 are given like numbers and may not be re-introduced. FIGS. 3A-3C are described collectively below.

Head support 228, first sidewall 224, and second sidewall 226 may be continuous with one another and form a unitary head support section shaped to surround the head of the subject. As appreciated from FIGS. 3A-3C, head support 228, first sidewall 224, and second sidewall 226 may be shaped to have an arcuate or semi-circular cross-section (e.g., in a plane formed by the y-axis and z-axis of reference axes 299). The head support section may curve upward through an axis perpendicular to central axis 206 (e.g., perpendicular axis 300). Perpendicular axis 300 may be perpendicular to central axis 206 as well as the x-axis and z-axis of reference axes 299, and may be parallel with the y-axis of reference axes 299.

Head and neck coil array 204 extends along central axis 206 from upper back support 214 to head support 228. As described above, upper back support 214 is flat and rectangular and couples to head support 228 at a region where first strap 220 and second strap 222 extend out from head support 228. As seen in FIG. 3B, upper back support 214 transitions to head support 228 via a neck support section 302. Neck support section 302 may be shaped to conform to a posterior side of the neck of the subject, and may curve upward along central axis 206 toward head support 228, to form a bottom surface 306 that curves in an asymptotic manner. Along the head support section, bottom surface 306 may be relatively flat (e.g., with little to no curvature along the central axis 206).

First strap 220 and second strap 222 may extend out from neck support section 302 along perpendicular axis 300. Each of first strap 220 and second strap 222 may curve upward (e.g., vertically upward, in the direction of the z-axis of reference axes 299) as the respective strap extends out from neck support section 302. As shown, each of first strap 220 and second strap 222 curves upward, through perpendicular axis 300, to form bottom surfaces that curve in an asymptotic manner. As shown in FIG. 3C, each of first strap 220 and second strap 222 may be rectangular in shape, although other shapes are possible. First strap 220 and second strap 222 may each extend beyond edges of upper back support 214, such that first strap 220, second strap 222, and neck support section 302 may collectively have a width that is greater than a width of upper back support 214 (e.g., in the direction of the y-axis of reference axes 299).

Each section of head and neck RF coil array 204 may be separate and detachable from the other components, or two or more of the components may be unitary and form one piece. For example, upper back support 214, neck support section 302, and head support 228 (including the two sidewalls 224, 226) may be unitary or otherwise fixedly coupled together. First strap 220 and second strap 222 may be removably coupled to head support 228 and/or neck support section 302, or first strap 220 and second strap 222 may be fixedly coupled to head support 228 and/or neck support section 302.

As mentioned above and described in more detail below, head and neck RF coil array 204 may include (at least partially) compressible material such as foam. The compressible material, while flexible, may be rigid enough to be formed to the shapes described above and illustrated in FIGS. 3A-3C. However, in some examples, additional structure or support may be provided to head and neck RF coil array 204 to allow for the curvature described above to be maintained even when the subject is positioned on head and neck RF coil array 204. In one example, a bottom surface of head and neck RF coil array 204 may include or be coupled to a rigid former, such as a former made of plastic or other rigid material. In such a configuration, each of the first strap and second strap may not be fixedly coupled to the rigid former to allow for the first strap and second strap to be folded over the neck of the subject during imaging.

In another example, head and neck RF coil array 204 may be shaped to match an interior of a traditional head and neck RF coil array. Traditional RF coil arrays may include a plurality of RF coil loops that include copper traces on a PCB, which is rigid and maintains the RF coils at fixed positions relative to each other. For example, a traditional RF coil array includes a PCB on which copper traces are formed and lumped electronic components are present (e.g., capacitors, inductors, etc.). Further, due to the configuration of the traditional RF coil array (e.g., due to heat generation by the RF coil array), a rigid and/or bulky housing material is required. When head and neck RF coil array 204 is placed in a traditional head and neck RF coil, the RF coils of the traditional head and neck RF coil may be disabled to prevent interference leading to degraded imaging. In this way, existing MRI systems may be retrofitted with the RF coil assembly of the present disclosure. When head and neck RF coil array 204 is positioned in a traditional head and neck RF coil array, head and neck RF coil array 204 may be fastened to the traditional coil array to prevent movement of head and neck RF coil array 204, or head and neck RF coil array 204 may not be fastened to the traditional coil array. In either example, the first and second straps may be maintained in non-fixed relation to the traditional coil array to allow the straps to be folded over the neck of the subject during imaging.

FIGS. 4A and 4B show example RF coil assemblies with any outer layers removed (e.g., outer surface material as well as any intervening foam layers) to illustrate the underlying RF coils. FIG. 4A shows a first RF coil assembly 400. First RF coil assembly is a non-limiting example of RF coil assembly 200, and as such includes a posterior RF coil array 420 (which may include separate lower and upper posterior RF coil arrays) and a head and neck RF coil array 404, which extend longitudinally along central axis 402 and extend laterally along perpendicular axis 410. FIGS. 4A-4B each include reference axes 499, which may be similar to the reference axes 199 and reference axes 299 described above (e.g., may have a similar relative arrangement of axes).

Head and neck RF coil array 404 includes a head support, neck support section, upper back support, and two straps, as described above with respect to FIGS. 2-3C, and a plurality of RF coils 422. Each portion of head and neck RF coil array 404 includes one or more RF coils positioned therein. As shown, the head support section includes six RF coils, the upper back support section includes eight RF coils, the neck support section includes three RF coils, first strap 408 includes four RF coils, and second strap 406 includes four RF coils, but other numbers of RF coils and other arrangements of RF coils are possible. Each RF coil of head and neck RF coil array 404 may include a loop portion and a coupling electronics portion, as will be explained in more detail below with respect to FIG. 6 and FIGS. 9-14. Each coupling electronics portion may be coupled to an interfacing cable, and each interfacing cable of head and neck RF coil array 404 may include a balun and may be bundled together at an interfacing connector 403. Interfacing connector 403 may be configured to couple head and neck RF coil array 404 to suitable components of an MRI system, such as controller unit, processing system, etc.

Posterior RF coil array 420 may include a plurality of RF coils 416. In the example shown in FIG. 4A, each RF coil of the plurality of RF coils 416 may be of uniform size and may be larger (e.g., have a larger loop diameter, such as 11 centimeters) than each RF coil of the plurality of RF coils 422 of head and neck RF coil array 404 (e.g., with the RF coils of the head and neck RF coil array 404 each having a loop diameter of eight (8) centimeters, in an example). However, other configurations are possible, such as all the RF coils being equal in size. The plurality of RF coils 416 may be arranged into an array. As shown, the plurality of RF coils 416 includes sixty (60) RF coils arranged into an array of five (5) RF coils by twelve (12) RF coils, though other RF coil numbers and arrangements are possible. A row of the plurality of RF coils 416 includes, for example, first RF coil 411, second RF coil 413, third RF coil 415, fourth RF coil 417, and fifth RF coil 419. Each RF coil (including the first through fifth RF coils 411-419) may include a loop portion and a coupling electronics portion, such as coupling electronics portion 418, as will be explained in more detail below with respect to FIG. 6. Each coupling electronics portion may be coupled to an interfacing cable, and each interfacing cable of posterior RF coil array 420 may include a balun, such as balun 412, and may be bundled together at an interfacing connector 401. Interfacing connector 401 may be configured to couple posterior RF coil array 420 to suitable components of an MRI system, such as controller unit, processing system, etc.

As described above with respect to FIG. 2, the posterior RF coil array may include two separate sections, a lower posterior RF coil array and an upper posterior RF coil array. Accordingly, the plurality of RF coils 416 may be arranged into two arrays, for example two arrays of five (5) RF coils by six (6) RF coils. In such examples, each RF coil array may include a separate interfacing connector. For example, each interfacing cable of the upper posterior RF coil array may be bundled together at a first interfacing connector and each interfacing cable of the lower posterior RF coil array may be bundled together at a different, second interfacing connector.

FIG. 4B shows a second RF coil assembly 450. Second RF coil assembly 450 is a non-limiting example of RF coil assembly 200, and as such includes a posterior RF coil array 466 (which may include separate lower and upper posterior RF coil arrays) and a head and neck RF coil array 456, which extend longitudinally along central axis 452. Second RF coil assembly 450 may be similar to first RF coil assembly 400, other than the sizing of the RF coils of the posterior RF coil array. Accordingly, description of the elements of first RF coil assembly 400 may likewise apply to similar elements of second RF coil assembly 450.

Head and neck RF coil array 456 includes a head support, neck support section, upper back support, and two straps (first strap 458 and second strap 460), as described above with respect to FIGS. 2-3C, and a plurality of RF coils 454. Each RF coil of head and neck RF coil array 456 may include a loop portion and a coupling electronics portion, as will be explained in more detail below with respect to FIG. 6. Each coupling electronics portion may be coupled to an interfacing cable, and each interfacing cable of head and neck RF coil array 456 may include a balun and may be bundled together at an interfacing connector 453. Interfacing connector 453 may be configured to couple head and neck RF coil array 456 to suitable components of an MRI system, such as controller unit, processing system, etc.

Posterior RF coil array 466 may include a plurality of RF coils 467. In the example shown in FIG. 4B, the RF coils of the plurality of RF coils 467 are not of uniform size, though each RF coil may be larger (e.g., have a larger loop diameter) than each RF coil of the plurality of RF coils 454 of head and neck RF coil array 456. The plurality of RF coils 467 may be arranged into an array as described above. Each RF coil may include a loop portion and a coupling electronics portion, such as coupling electronics portion 470, similar to those explained in more detail below with respect to FIG. 6. Each coupling electronics portion may be coupled to an interfacing cable, and each interfacing cable of posterior RF coil array 466 may include a balun, and may be bundled together at an interfacing connector 451. Interfacing connector 451 may be configured to couple posterior RF coil array 466 to suitable components of an MRI system, such as controller unit, processing system, etc.

The plurality of RF coils 467 may include RF coils having loop portions of different diameters. For example, a first RF coil 462 may have a loop portion with a first diameter (e.g., 13 centimeters), a second RF coil 464 may have a loop portion with a second diameter (e.g., 12 centimeters), and a third RF coil 468 may have a loop portion with the third diameter (e.g., 11 centimeters). The first diameter may be larger than the second diameter, and the second diameter may be larger than the third diameter. The different sized RF coils may be arranged in the array in an alternating arrangement in order to increase a signal-to-noise ratio of the posterior RF coil array 466, particularly during conditions in which a spine of a patient is imaged via the posterior RF coil array 466. Additionally, in the configuration described above, each RF coil may be further electrically isolated from each adjacent RF coil such that each RF coil of the posterior RF coil array 466 does not alter electrical signals transmitted by (or MR signals received by) each other RF coil of the posterior RF coil array 466.

Thus, a first column of RF coils 472 includes alternating sizes of RF coils, for example the largest sized RF coils (e.g., RF coil 462) alternating with the smallest sized RF coils (e.g., RF coil 469). In first column of RF coils 472, every other RF coil is the largest size coil and every intervening RF coil is the smallest size coil. Three middle columns of RF coils 473 includes uniform sized RF coils, herein all the medium sized coils (e.g., RF coil 464). A last column of RF coils 474 includes alternating sizes of RF coils, for example the smallest sized RF coils (e.g., RF coil 468) alternating with the largest sized RF coils (e.g., RF coil 463). In last column of RF coils 474, every other RF coil is the smallest size coil and every intervening RF coil is the largest size coil. Further, the alternating largest-smallest arrangement of last column of RF coils 474 may be offset from the altering smallest-largest arrangement of first column of RF coils 472, such that each row of RF coils includes only one largest size RF coil and only one smallest size RF coil, and then three medium size RF coils.

FIG. 5 shows a cross-sectional view of posterior RF coil array 420 of FIG. 4A, taken across perpendicular axis 410. A set of reference axes 498 is included in FIG. 5. Due to the cross-sectional nature of the view of FIG. 5, only two axes are present, the z axis and the y axis. Posterior RF coil array 420 includes a first, outer layer 514. Outer layer 514 may include one or more sheets of a flexible fabric material, such as DARTEX® fabric. Outer layer 514 may have a first thickness 510. In one example, first thickness 510 may be 1.5 centimeters or less. Posterior RF coil array 420 includes a second, inner layer 516. Inner layer 516 may include a compressible material such as memory foam and may have a second thickness 512. Second thickness 512 may be greater than first thickness 510 and may be 5 centimeters, in one example.

Inner layer 516 may have a plurality of annular grooves each configured to accommodate an RF coil. As shown in FIG. 5, inner layer 516 includes a first annular groove 500. First annular groove 500 accommodates first RF coil 411. For example, first annular groove 500 may be a cut or indentation made in inner layer 516 that is sized to fit first RF coil 411. When first RF coil 411 is positioned in first annular groove 500, the material forming inner layer 516 may surround the loop portion of first RF coil 411, therein embedding the loop portion of first RF coil 411 in the second inner layer. Similar configurations are present for each RF coil of posterior RF coil array 420. Thus, inner layer 516 includes a second annular groove 502 (accommodating second RF coil 413), a third annular groove 504 (accommodating third RF coil 415), a fourth annular groove 506 (accommodating fourth RF coil 417), and a fifth annular groove 508 (accommodating fifth RF coil 419). While not shown in FIG. 5, a plurality of rectangular grooves may be present in inner layer 516, each adjacent a respective annular groove. The rectangular grooves may accommodate the coupling electronics portion of each RF coil.

Each annular groove (and hence each RF coil) may be present at a top portion of inner layer 516, and thus a top surface of each RF coil may not be covered by the material forming inner layer 516. However, outer layer 514 may cover the top surface of each RF coil. Each of outer layer 514 and inner layer 516 may be compressible, allowing the RF coils embedded therein to conform to a shape of the subject positioned on the posterior RF coil array.

While FIG. 5 was described with respect to posterior RF coil array 420, the other RF coil arrays described herein (e.g., RF coil assembly 200) may have a similar configuration. As such, each RF coil array described herein may include a plurality of RF coils embedded in an inner layer of compressible material and covered with an outer layer of compressible material. However, in some examples, the RF coils described above may not be embedded in a compressible material as described with respect to FIG. 5, but may instead be stitched or otherwise coupled to or between one or more layers of flexible material, such as DARTEX®.

The compressible material may a sturdy foam, such as a high density foam, closed cell polyurethane, and the like. The embedded RF coils may be topped with a layer of soft foam such as viscoelastic polyurethane foam, Evlon foam, memory foam, and the like, and sandwiched between a top outer surface and a bottom outer surface of durable, cleanable material, such as DARTEX®. However, in some examples, the RF coil assembly may be embedded into the MRI system table, in which case the bottom outer surface may be dispensed with.

Figure 6:
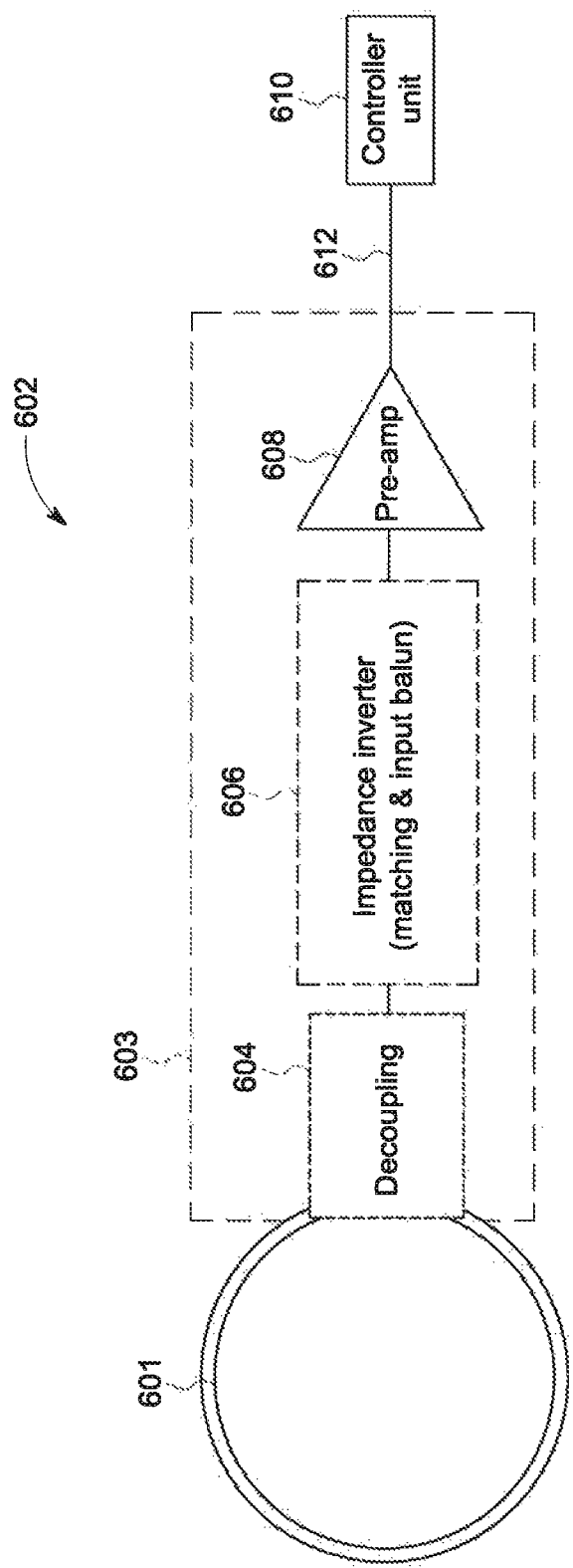
FIG. 6 schematically shows an RF coil coupled to a controller unit of the MRI system of FIG. 1, in accordance with an exemplary embodiment.

Turning now to FIG. 6, a schematic view of an RF coil 602 including a loop portion 601 coupled to a controller unit 610 via coupling electronics portion 603 and a coil-interfacing cable 612 is shown. In one example, the RF coil may be a surface receive coil, which may be single- or multi-channel. The RF coil 602 is one non-limiting example element of RF coil unit 14 of FIG. 1 (e.g., similar to the other RF coil arrays described herein, such as posterior RF coil arrays 202, 420, and/or 466, and/or head and neck RF coil arrays 204, 404, and/or 456) and as such may operate at one or more frequencies in the MR apparatus 10. The coil-interfacing cable 612 may be a coil-interfacing cable extending between the coupling electronics portion 603 and an interfacing connector of an RF coil array or a RF coil array interfacing cable extending between the interfacing connector of the RF coil array and the MRI system controller unit 610. The controller unit 610 may be associated with and/or may be a non-limiting example of the data processing unit 31 or controller unit 25 in FIG. 1.

The RF coil of the present disclosure uses a significantly smaller amount of copper, printed circuit board (PCB) material and electronic components than what is used in a conventional RF coil. The RF coil disclosed herein may include parallel elongated wire conductors, encapsulated and separated by a dielectric material, forming the coil element. The parallel wires form a low reactance structure without need for discrete capacitors. The minimal conductor, sized to keep losses tolerable, eliminates much of the capacitance between coil loops, and reduces electric field coupling. By interfacing with a large sampling impedance, currents are reduced and magnetic field coupling is minimized. The electronics are minimized in size and content to keep mass and weight low and prevent excessive interaction with the desired fields. Packaging can now be extremely flexible which allows contouring to anatomy, optimizing signal to noise ratio (SNR) and imaging acceleration.

A traditional RF receive coil for MR is has several conductive intervals joined between themselves by capacitors. By adjusting the capacitors' capacitances, the impedance of the RF coil may be brought to its minimal value, usually characterized by low resistance. At resonant frequency, stored magnetic and electric energy alternate periodically. Each conductive interval, due to its length and width, possesses a certain self-capacitance, where electric energy is periodically stored as static electricity. The distribution of this electricity takes place over the entire conductive interval length of the order of 5-15 cm, causing similar range electric dipole field. In a proximity of a large dielectric load, self-capacitance of the intervals change—hence detuning of the coil. In case of a lossy dielectric, dipole electric field causes Joule dissipation characterized by an increase overall resistance observed by the coil.

In contrast, the RF coil of the present disclosure represents almost an ideal magnetic dipole antenna as its common mode current is uniform in phase and amplitude along its perimeter. The capacitance of the RF coil is built between the two wires along the perimeter of the loop. The conservative electric field is strictly confined within the small cross-section of the two parallel wires and dielectric filler material. In the case of two RF coil loops overlapping, the parasitic capacitance at the cross-overs is greatly reduced in comparison to two overlapped copper traces of traditional RF coils. RF coil thin cross-sections allows better magnetic decoupling and reduces or eliminates critical overlap between two loops in comparison to two traditional trace-based coil loops.

The coupling electronics portion 603 may be coupled to the loop portion of the RF coil 602. Herein, the coupling electronics portion 603 may include a decoupling circuit 604, impedance inverter circuit 606, and a pre-amplifier 608. The decoupling circuit 604 may effectively decouple the RF coil during a transmit operation. Typically, the RF coil 602 in its receive mode may be coupled to a body of a subject being imaged by the MR apparatus in order to receive echoes of the RF signal transmitted during the transmit mode. If the RF coil 602 is not used for transmission, then it may be necessary to decouple the RF coil 602 from the RF body coil while the RF body coil is transmitting the RF signal. The decoupling of the receive coil from the transmit coil may be achieved using resonance circuits and PIN diodes, microelectromechanical systems (MEMS) switches, or another type of switching circuitry. Herein, the switching circuitry may activate detuning circuits operatively connected to the RF coil 602.

The impedance inverter circuit 606 may form an impedance matching network between the RF coil 602 and the pre-amplifier 608. The impedance inverter circuit 606 is configured to transform a coil impedance of the RF coil 602 into an optimal source impedance for the pre-amplifier 608. The impedance inverter circuit 606 may include an impedance matching network and an input balun. The pre-amplifier 608 receives MR signals from the corresponding RF coil 602 and amplifies the received MR signals. In one example, the pre-amplifier may have a low input impedance that is configured to accommodate a relatively high blocking or source impedance. Additional details regarding the RF coil and associated coupling electronics portion will be explained in more detail below with respect to FIGS. 8 and 9. The coupling electronics portion 603 may be packaged in a very small PCB approximately two (2) $cm^2$ in size or smaller. The PCB may be protected with a conformal coating or an encapsulating resin.

The coil-interfacing cable 612, such as an RF coil array interfacing cable, may be used to transmit signals between the RF coils and other aspects of the processing system, for example to control the RF coils and/or to receive information from the RF coils. The RF coil array interfacing cables may be disposed within the bore or imaging space of the MR apparatus (such as MRI apparatus 10 of FIG. 1) and subjected to electro-magnetic fields produced and used by the MRI apparatus. In MRI systems, coil-interfacing cables, such as coil-interfacing cable 612, may support transmitter-driven common-mode currents, which may in turn create field distortions and/or unpredictable heating of components. Typically, common-mode currents are blocked by using baluns. Baluns or common-mode traps provide high common-mode impedances, which in turn reduces the effect of transmitter-driven currents.

Thus, coil-interfacing cable 612 may include one or more baluns. In traditional coil-interfacing cables, baluns are positioned with a relatively high density, as high dissipation/ voltages may develop if the balun density is too low or if baluns are positioned at an inappropriate location. However, this dense placement may adversely affect flexibility, cost, and performance. As such, the one or more baluns in the coil-interfacing cable may be continuous baluns to ensure no high currents or standing waves, independent of positioning. The continuous baluns may be distributed, flutter, and/or butterfly baluns. Additional details regarding the coil-interfacing cable and baluns will be presented below with respect to FIGS. 11-13.

Figure 7:
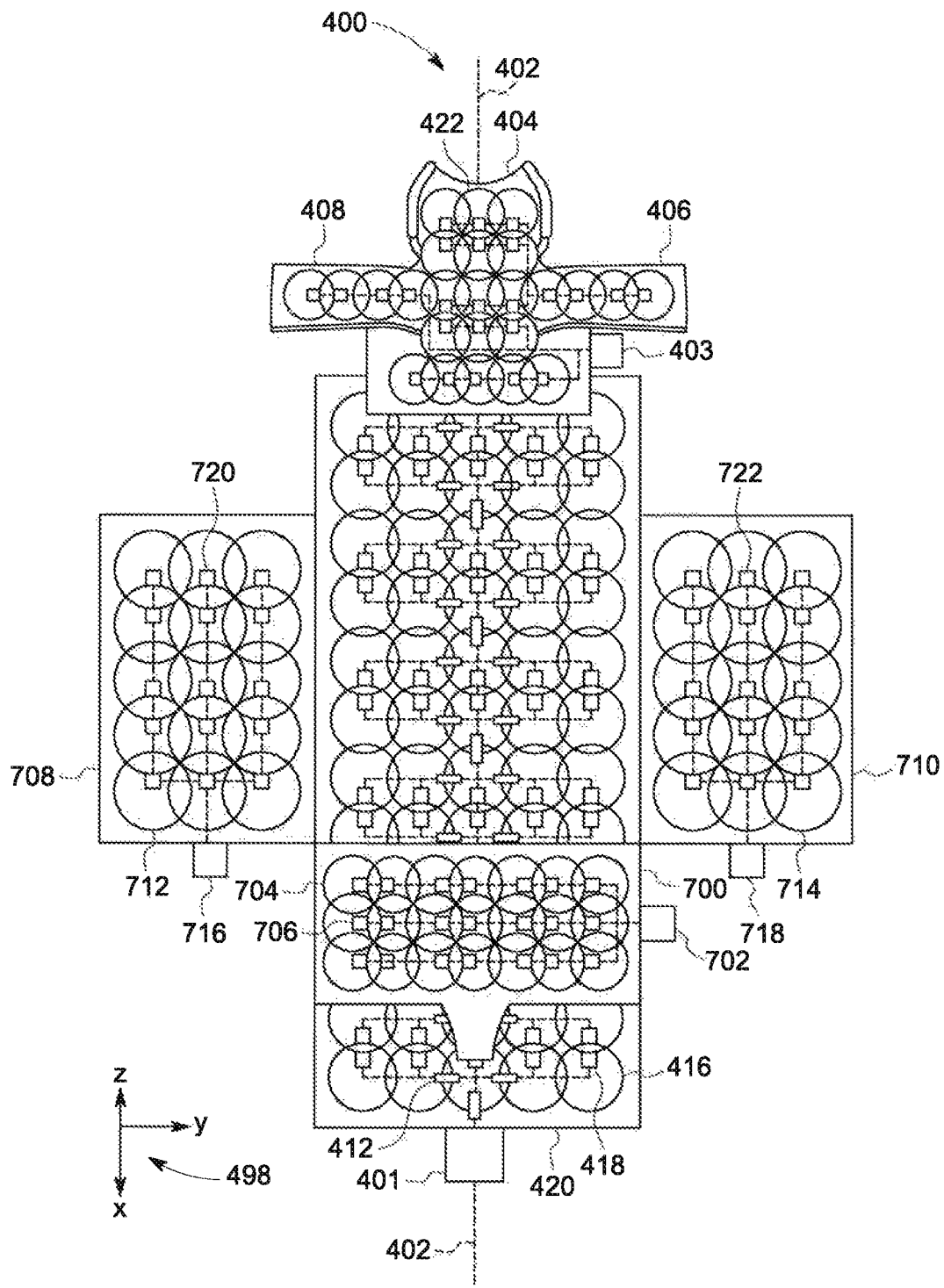
FIG. 7 shows an RF coil arrangement of a head and neck RF coil array, a posterior RF coil array including a plurality of extensions, and a pelvic RF coil array for the MRI system of FIG. 1, in accordance with an exemplary embodiment.

FIG. 7 shows the RF coil assembly 400 of FIG. 4A with additional RF coil array extensions. The additional RF coil array extensions are configured to fold over the posterior RF coil array 420 to be positioned on an anterior side of the subject. In this way, a near full-body array of RF coils may be provided.

A first extension 708 is coupled to a first side of posterior RF coil array 420 (in examples where posterior RF coil array 420 includes two separate but couplable portions, first extension 708 may be coupled to the upper posterior RF coil array). First extension 708 may include flexible, compressible material (as described above with respect to FIG. 5) in between layers of thin, flexible material, such as DAR-TEX®. In other examples, the compressible material may be omitted. First extension 708 includes a plurality of RF coils 712, herein arranged in an array (e.g., of fifteen RF coils). Each RF coil of first extension 708 may include a loop portion and a coupling electronics portion, such as coupling electronics portion 720, as explained above with respect to FIG. 6. Each coupling electronics portion may be coupled to an interfacing cable, and each interfacing cable of first extension 708 may include a balun and may be bundled together at an interfacing connector 716. Interfacing connector 716 may be configured to couple first extension 708 to suitable components of an MRI system, such as a controller unit, processing system, etc. (e.g., controller unit 25 shown by FIG. 1 and described above).

A second extension 710 is coupled to a second side of posterior RF coil array 420. In examples where posterior RF coil array 420 includes two separate but couplable portions, second extension 710 may be coupled to the upper posterior RF coil array. Second extension 710 may be similar to first extension 708 and thus may include a plurality of RF coils 714, herein arranged in an array (e.g., an array of fifteen RF coils). The RF coils may be embedded in compressible material and/or layered between flexible outer layers of material. Each RF coil of second extension 710 may include a loop portion and a coupling electronics portion, such as coupling electronics portion 722, as explained above with respect to FIG. 6. Each coupling electronics portion may be coupled to an interfacing cable, and each interfacing cable of second extension 710 may include a balun and may be bundled together at an interfacing connector 718. Interfacing connector 718 may be configured to couple second extension 710 to suitable components of an MRI system, such as controller unit, processing system, etc.

Each of first extension 708 and second extension 710 may be removably attached to posterior RF coil array 420, or first extension 708 and second extension 710 may be fixedly attached. First extension 708 and second extension 710 may each be configured to fold over posterior RF coil array 420. For example, a seam or other flexible joint may be present where first extension 708 couples to posterior RF coil array 420 (e.g., along an axis parallel to central axis 402). First extension 708 may be folded or bent along the seam, such that an inner portion of first extension faces and/or is in contact with an anterior portion of the subject. Second extension 710 may be foldable in a similar manner. When both first extension 708 and second extension 710 are folded over a subject, first extension 708 and second extension 710 may overlap, at least to an extent, and the amount of overlap may vary based on patient size.

A pelvic RF coil array 700 may be coupled to posterior RF coil array 420 (in examples where posterior RF coil array 420 includes two separate but couplable portions, pelvic RF coil array 700 may be coupled to the lower posterior RF coil array). Pelvic RF coil array 700 may be similar to first extension 708 and/or second extension 710 and thus may include a plurality of RF coils 704, herein arranged in an array (e.g., of 28 RF coils). The RF coils may be embedded in compressible material and/or layered between flexible outer layers of material. Each RF coil of pelvic RF coil array 700 may include a loop portion and a coupling electronics portion, such as coupling electronics portion 706, as explained above with respect to FIG. 6. Each coupling electronics portion may be coupled to an interfacing cable, and each interfacing cable of pelvic RF coil array 700 may include a balun and may be bundled together at an interfacing connector 702. Interfacing connector 702 may be configured to couple pelvic RF coil array 700 to suitable components of an MRI system, such as the controller unit, processing system, etc.

Pelvic RF coil array 700 may be removably attached to posterior RF coil array 420, or it may be fixedly attached. Pelvic RF coil array 700 may be configured to fold over posterior RF coil array 420. For example, a seam or other flexible joint may be present where pelvic RF coil array 700 couples to posterior RF coil array 420 (e.g., along an axis perpendicular to central axis 402). Pelvic RF coil array 700 may be folded or bent along the seam, such that an inner portion of pelvic RF coil array 700 faces and/or is in contact with an anterior portion of the subject. Additionally, the coupling between pelvic RF coil array 700 and posterior RF coil array 420 may be configured in a manner that accommodates the legs of the subject (e.g., the coupling may form leg holes through which the subject's legs may extend). In this way, when pelvic RF coil array 700 is folded over posterior RF coil array 420, pelvic RF coil array 700 may be positioned on and/or around the pelvic region of the subject, enabling close coupling of the RF coils in pelvic RF coil array 700 to the prostate, bladder, ovaries, or other traditionally hard to image locations of the pelvic region.

Figure 8:
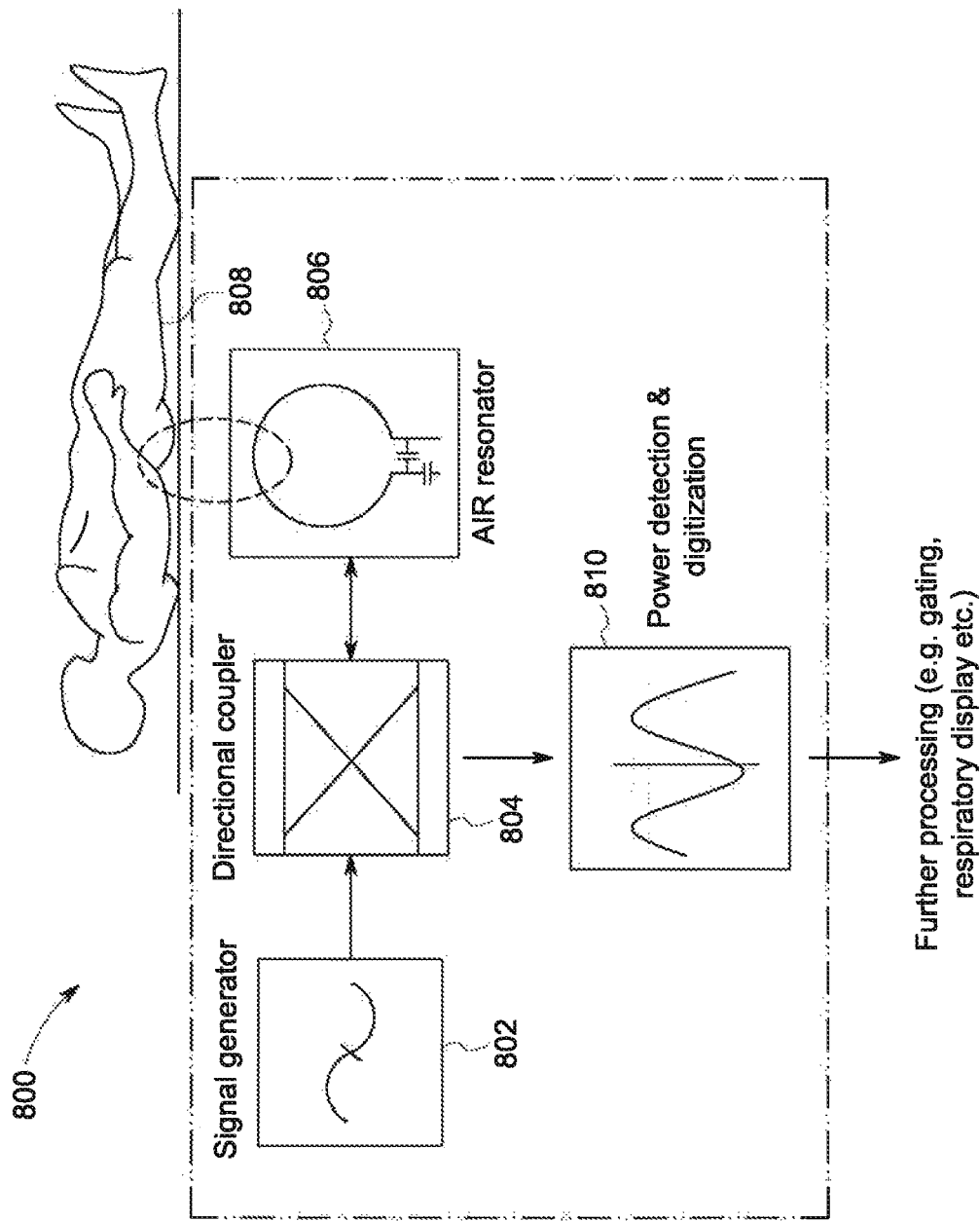
FIG. 8 schematically shows a system for respiratory motion detection of a subject for the MRI system of FIG. 1, in accordance with an exemplary embodiment.

FIG. 8 shows a schematic illustration of a respiratory motion detector 800. The respiratory motion detector includes a separate RF coil array that includes one or more RF coils (which may be referred to herein as respiration motion detection RF coils) configured to operate at a different resonant frequency relative to the RF coils of the posterior RF coil array. In some embodiments, the respiration motion detection RF coils are separate RF coils that are positioned between the posterior RF coil array and the subject. In some embodiments, the respiration motion detection RF coils are part of the posterior RF coil array. Other components of this system, such as signal generator 802, directional coupler 804, and power detection sensor and digitization module 810, are all separate components from the MRI system. However, at least in some examples, output from the power detection sensor and digitization module 810 may be sent to the MRI system for display or other processing.

The signal generator 802 produces a continuous high frequency (HF) signal of 250 MHz at 0 dBm power output. This signal is transferred through to the directional coupler 804 towards the 150 mm AIR resonator 806, which is an RF coil (e.g., respiration motion detection RF coil) similar to the other RF coils described herein (e.g., RF coils of RF coil unit 14, posterior RF coil array 202, etc. described above). However, the AIR resonator 806 is configured to operate at a different resonant frequency (e.g., 250 Mhz) than the RF coils described above (e.g., RF coils for imaging the spine of the patient, for example, such as the RF coils 411, 413, 415, 417, and 419 shown by FIG. 4A and described above). The AIR resonator 806 may operate at the different resonant frequency due to the AIR resonator 806 have a different coil diameter, different dielectric material, and/or different number of cuts in a conductor (e.g., wire) of the RF coil, relative to the other RF coils in the posterior array.

This RF coil interacts with the patient 808 in a process called "loading". The coil loading varies with respiration and changes the resonating frequency and impedance of the coil, which leads to signal reflection back to the signal generator 802. The reflected signal power is detected by the directional coupler 804 and transferred to the power detection sensor and digitization module 810. From the power detection sensor and digitization module 810, the signal may be digitized and forwarded to a system gating sub-system and further processed for gating, triggering or visual presentation.

The power detection sensor and digitization module 810 may further include an amplification system and/or signal filter for further processing of the signal prior to outputting the signal to the MRI system for display or other processing. For example, an RF coil array (e.g., the posterior RF coil arrays described above) may include a plurality of respiratory motion detection RF coils. The power detection sensor and digitization module 810 may be electrically coupled with the plurality of respiratory motion detection RF coils and configured to receive electrical signals from the plurality of respiratory motion detection RF coils. A signal amplification and/or signal filtering sub-system may be electrically coupled between an electrical output of the power detection sensor and digitization module 810 and an electrical input of the MRI system (e.g., of the controller of the MRI system) in order to process electrical signals transmitted to the MRI system by the power detection sensor and digitization module 810. The sub-system may analyze the electrical signals transmitted to the power detection sensor and digitization module 810 from each respiratory motion detection RF coil and determine one or more specific respiratory motion detection RF coils of the plurality of respiratory motion detection RF coils that have a stronger signal strength (e.g., higher magnitude signal and/or higher signal-to-noise ratio) in a respiration frequency range. The sub-system may amplify the electrical signals from the one or more specific respiratory motion detection RF coils prior to transmission of electrical signals to the MRI system in order to increase a respiratory motion detection quality of the RF coil array. In this way, the respiratory motion detection quality of the RF coil array and the included respiratory motion detection RF coils may be increased for a variety of different patient sizes. Additionally, the respiratory motion detection quality may be increased for a variety of different positions of the RF coil array relative to the patient.

In some examples, the detected respiratory motion may be utilized by the MRI system (e.g., processed by the electronic controller of the MRI system) to increase an imaging quality of the MRI system. For example, although the MRI system does not image the patient via the respiratory motion detection RF coils, the MRI system may process the signals from the respiratory motion detection RF coils in order to compensate for a motion of the body of the patient during imaging of the patient via the RF coil arrays (e.g., posterior RF coil array 202, head and neck RF coil array 204, etc., as described above). In one example, the MRI system may detect the respiratory motion of the patient (e.g., via the respiratory motion detection RF coils) and may image the patient via the RF coils of the RF coil arrays (e.g., the RF coils not utilized for respiratory motion detection, such as the plurality of RF coils 416) for various durations of the respiratory cycle of the patient. For example, the MRI system may detect the respiratory motion via the respiratory motion detection RF coils and image the patient via the RF coils of the RF coils arrays during an exhalation portion of the patient's respiratory cycle. In other examples, the MRI system may adjust the imaging of the patient via the RF coils of the RF coil arrays in response to the detected respiratory motion of the patient in a different way (e.g., via one or more image averaging algorithms, etc.).

Figure 9:
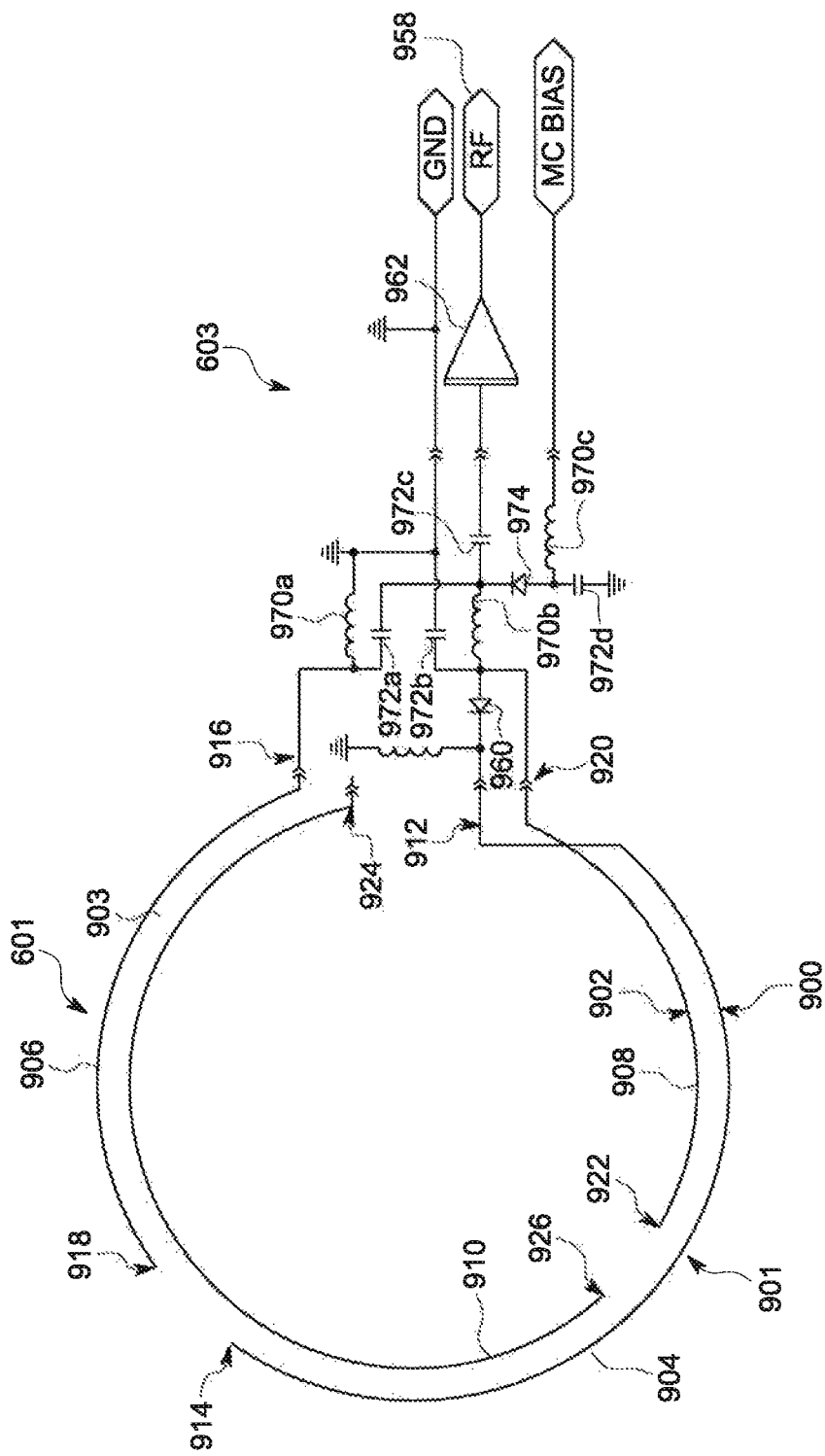
FIG. 9 shows a first RF coil and associated coupling electronics of the MRI system of FIG. 1, in accordance with an exemplary embodiment.

FIG. 9 is a schematic of an RF coil 901 having segmented conductors formed in accordance with an embodiment. RF coil 901 is a non-limiting example of RF coil 602 of FIG. 6 and as such includes loop portion 601 and coupling electronics portion 603 of RF coil 602. The coupling electronics portion allows the RF coil to transmit and/or receive RF signals when driven by a data acquisition unit (e.g., the data acquisition unit 24 shown in FIG. 1). In the illustrated embodiment, the RF coil 901 includes a first conductor 900 and a second conductor 902. The first and second conductors 900, 902 may be segmented such that the conductors form an open circuit (e.g., form a monopole). The segments of the conductors 900, 902 may have different lengths, as is discussed below. The length of the first and second conductors 900, 902 may be varied to achieve a desired distributed capacitance, and accordingly, a desired resonance frequency.

The first conductor 900 includes a first segment 904 and a second segment 906. The first segment 904 includes a driven end 912 at an interface terminating to coupling electronics portion 603, which will be described in more detail below. The first segment 904 also includes a floating end 914 that is detached from a reference ground, thereby maintaining a floating state. The second segment 906 includes a driven end 916 at the interface terminating to the coupling electronics portion and a floating end 918 that is detached from a reference ground.

The second conductor 902 includes a first segment 908 and a second segment 910. The first segment 908 includes a driven end 920 at the interface. The first segment 908 also includes a floating end 922 that is detached from a reference ground, thereby maintaining a floating state. The second segment 910 includes a driven end 924 at the interface, and a floating end 926 that is detached from a reference ground. The driven end 924 may terminate at the interface such that end 924 is only coupled to the first conductor through the distributed capacitance. The capacitors shown around the loop between the conductors represent the capacitance between the wires.

The first conductor 900 and the second conductor 902 exhibit a distributed capacitance along the length of the first and second segments 904, 906, 908, 910. The first segments 904, 908 may have a different length than the second segments 906, 910. The relative difference in length between the first segments 904, 908 and the second segments 906, 910 may be used to produce an effective LC circuit have a resonance frequency at the desired center frequency. For example, by varying the length of the first segments 904, 908 relative to the lengths of the second segments 906, 910, an integrated distributed capacitance may be varied.

In the illustrated embodiment, the first and second conductors 900, 902 are shaped into a loop portion that terminates to an interface. But in other embodiments, other shapes are possible. For example, the loop portion may be a polygon, shaped to conform the contours of a surface (e.g., housing), and/or the like. The loop portion defines a conductive pathway along the first and second conductors. The first and second conductors are void of any discrete or lumped capacitive or inductive elements along an entire length of the conductive pathway. The loop portion may also include loops of varying gauge of stranded or solid conductor wire, loops of varying diameters with varying lengths of the first and second conductors 900, 902, and/or loops of varying spacing between the first and second conductors. For example, each of the first and second conductors may have no cuts or gaps (no segmented conductors) or one or more cuts or gaps (segmented conductors) at various locations along the conductive pathway.

Distributed capacitance (DCAP), as used herein, represents a capacitance exhibited between conductors along the length of the conductors and is void of discrete or lumped capacitive components and discrete or lumped inductive components. In the examples herein, the capacitance may grow in an even and uniform manner along the length of the first and second conductors 900, 902.

A dielectric material 903 encapsulates and separates the first and second conductors 900, 902. The dielectric material 903 may be selectively chosen to achieve a desired distributive capacitance. The dielectric material 903 may be based on a desired permittivity E to vary the effective capacitance of the loop portion. For example, the dielectric material 903 may be air, rubber, plastic, or any other dielectric material. In one example, the dielectric material may be polytetrafluoroethylene (pTFE). For example, the dielectric material 903 may be an insulating material surrounding the parallel conductive elements of the first and second conductors 900, 902. Alternatively, the first and second conductors 900, 902 may be twisted upon one another to form a twisted pair cable. As another example, the dielectric material 903 may be a plastic material. The first and second conductors 900, 902 may form a coaxial structure in which the plastic dielectric material 903 separates the first and second conductors. As another example, the first and second conductors may be configured as planar strips.

The coupling electronics portion 603 is operably and communicatively coupled to the RF driver unit 22, the data acquisition unit 24, controller unit 25, and/or data processing unit 31 to allow the RF coil 602 to transmit and/or receive RF signals. In the illustrated embodiment, the coupling electronics portion 603 includes a signal interface 958 configured to transmit and receive the RF signals.

As explained above with reference to FIG. 6, the coupling electronics portion 603 includes a decoupling circuit, impedance inverter circuit, and pre-amplifier. As illustrated in FIG. 9, the decoupling circuit includes a decoupling diode 960. The decoupling diode 960 may be provided with voltage from MC_BIAS, for example, in order to turn decoupling diode 960 on. When on, decoupling diode 960 causes conductor 900 to short with conductor 902, thus causing the coil be off-resonance and hence decouple the coil during a transmit operation, for example.

The impedance inverter circuit includes a plurality of inductors, including first inductor 970a, second inductor 970b, and third inductor 970c; a plurality of capacitors, including first capacitor 972a, a second capacitor 972b, a third capacitor 972c, and a fourth capacitor 972d; and a diode 974. The impedance inverter circuit includes matching circuitry and an input balun. As shown, the input balun is a lattice balun that includes first inductor 970a, second inductor 970b, first capacitor 972a, and second capacitor 972b. In one example, diode 974 limits the direction of current flow to block RF receive signals from proceeding into decoupling bias branch (MC_BIAS).

In one example, the RF, GND, and MC_BIAS connections are part of a single cable. For example, the cable may be a triaxial cable with a center conductor and two surrounding shields. The center conductor may electrically conduct the RF signal and pre-amp control, a first shield may be the GND connection (e.g., ground), and a second, outermost shield may be the MC_BIAS connection (e.g., multi-coil bias for diode decoupling control). The cable may connect to an interface board (along with one or more other cables of RF coils), with a connector of the interface board electrically coupling the cable to the MRI system.

The pre-amplifier 962 may be a low input impedance pre-amplifier that is optimized for high source impedance by the impedance matching circuitry. The pre-amplifier may have a low noise reflection coefficient, $\gamma$, and a low noise resistance, Rn. In one example, the pre-amplifier may have a source reflection coefficient of $\gamma$ substantially equal to 0.0 and a normalized noise resistance of Rn substantially equal to 0.0 in addition to the low noise figure. However, y values substantially equal to or less than 0.1 and Rn values substantially equal to or less than 0.2 are also contemplated. With the pre-amplifier having the appropriate $\gamma$ and Rn values, the pre-amplifier provides a blocking impedance for RF coil 901 while also providing a large noise circle in the context of a Smith Chart. As such, current in RF coil 901 is minimized, the pre-amplifier is effectively noise matched with RF coil 901 output impedance. Having a large noise circle, the pre-amplifier yields an effective SNR over a variety of RF coil impedances while producing a high blocking impedance to RF coil 901.

In some examples, the pre-amplifier 962 may include an impedance transformer that includes a capacitor and an inductor. The impedance transformer may be configured to alter the impedance of the pre-amplifier to effectively cancel out a reactance of the pre-amplifier, such as capacitance caused by a parasitic capacitance effect. Parasitic capacitance effects can be caused by, for example, a PCB layout of the pre-amplifier or by a gate of the pre-amplifier. Further, such reactance can often increase as the frequency increases. Advantageously, however, configuring the impedance transformer of the pre-amplifier to cancel, or at least minimize, reactance maintains a high impedance (i.e. a blocking impedance) to RF coil 901 and an effective SNR without having a substantial impact on the noise figure of the pre-amplifier. The lattice balun described above may be a non-limiting example of an impedance transformer.

In examples, the pre-amplifier described herein may a low input pre-amplifier. For example, in some embodiments, a "relatively low" input impedance of the preamplifier is less than approximately five (5) ohms at resonance frequency. The coil impedance of the RF coil 901 may have any value, which may be dependent on coil loading, coil size, field strength, and/or the like. Examples of the coil impedance of the RF coil 901 include, but are not limited to, between approximately two (2) ohms and approximately ten (10) ohms at 1.5 T magnetic field strength, and/or the like. The impedance inverter circuitry is configured to transform the coil impedance of the RF coil 901 into a relatively high source impedance. For example, in some embodiments, a "relatively high" source impedance is at least approximately one-hundred (100) ohms and may be greater than one-hundred-and-fifty (150) ohms.

The impedance transformer may also provide a blocking impedance to the RF coil 901. Transformation of the coil impedance of the RF coil 901 to a relative high source impedance may enable the impedance transformer to provide a higher blocking impedance to the RF coil 901. Exemplary values for such higher blocking impedances include, for example, a blocking impedance of at least five-hundred (500) ohms, and at least one-thousand (1000) ohms.

It should be understood that the decoupling circuit shown in FIG. 9 is for illustration not for limitation. Any appropriate decoupling configurations can be used to decouple the RF coil during the transmit operation.

Figure 10:
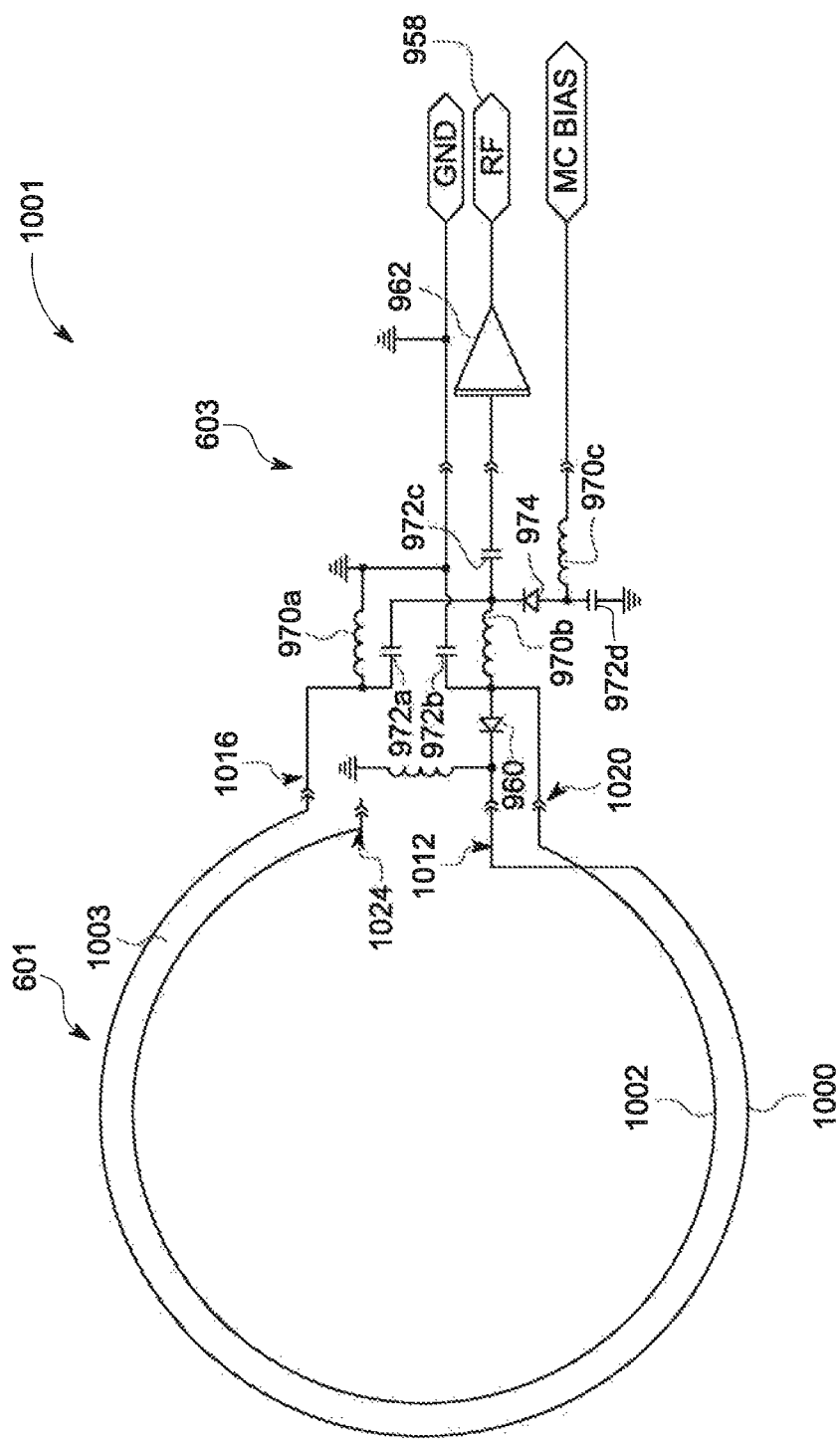
FIG. 10 shows a second RF coil and associated coupling electronics of the MRI system of FIG. 1, in accordance with an exemplary embodiment.

FIG. 10 is a schematic of an RF coil 1001 and coupling electronics portion 603 according to another embodiment. The RF coil of FIG. 10 is a non-limiting example of the RF coil and coupling electronics of FIG. 6, and as such includes a loop portion 601 and coupling electronics portion 603. The coupling electronics allows the RF coil to transmit and/or receive RF signals when driven by the data acquisition unit 24 (shown in FIG. 1). The RF coil 1001 includes a first conductor 1000 in parallel with a second conductor 1002. At least one of the first and second conductors 1000, 1002 are elongated and continuous.

In the illustrated embodiment, the first and second conductors 1000, 1002 are shaped into a loop portion that terminates to an interface. But in other embodiments, other shapes are possible. For example, the loop portion may be a polygon, shaped to conform the contours of a surface (e.g., housing), and/or the like. The loop portion defines a conductive pathway along the first and second conductors 1000, 1002. The first and second conductors 1000, 1002 are void of any discrete or lumped capacitive or inductive components along an entire length of the conductive pathway. The first and second conductors 1000, 1002 are uninterrupted and continuous along an entire length of the loop portion. The loop portion may also include loops of varying gauge of stranded or solid conductor wire, loops of varying diameters with varying lengths of the first and second conductors 1000, 1002, and/or loops of varying spacing between the first and second conductors. For example, each of the first and second conductors may have no cuts or gaps (no segmented conductors) or one or more cuts or gaps (segmented conductors) at various locations along the conductive pathway.

The first and second conductors 1000, 1002 have a distributed capacitance along the length of the loop portion (e.g., along the length of the first and second conductors 1000, 1002). The first and second conductors 1000, 1002 exhibit a substantially equal and uniform capacitance along the entire length of the loop portion. Distributed capacitance (DCAP), as used herein, represents a capacitance exhibited between conductors that grows evenly and uniformly along the length of the conductors and is void of discrete or lumped capacitive components and discrete or lumped inductive components. In the examples herein, the capacitance may grow in a uniform manner along the length of the first and second conductors 1000, 1002. At least one of the first and second conductors 1000, 1002 are elongated and continuous. In the illustrated embodiment, both the first and second conductors 1000, 1002 are elongated and continuous. But in other embodiments, only one of the first or second conductors 1000, 1002 may be elongated and continuous. The first and second conductors 1000, 1002 form continuous distributed capacitors. The capacitance grows at a substantially constant rate along the length of the conductors 1000, 1002. In the illustrated embodiment, the first and second conductors 1000, 1002 forms an elongated continuous conductors that exhibits DCAP along the length of the first and second conductors 1000, 1002. The first and second conductors 1000, 1002 are void of any discrete capacitive and inductive components along the entire length of the continuous conductors between terminating ends of the first and second conductors 1000, 1002. For example, the first and second conductors 1000, 1002 does not include any discrete capacitors, nor any inductors along the length of the loop portion.

A dielectric material 1003 separates the first and second conductors 1000, 1002. The dielectric material 1003 may be selectively chosen to achieve a select distributive capacitance. The dielectric material 1003 may be based on a desired permittivity E to vary the effective capacitance of the loop portion. For example, the dielectric material 1003 may be air, rubber, plastic, or any other dielectric material. In one example, the dielectric material may be polytetrafluoroethylene (pTFE). For example, the dielectric material 1003 may be an insulating material surrounding the parallel conductive elements of the first and second conductors 1000, 1002. Alternatively, the first and second conductors 1000, 1002 may be twisted upon one another to from a twisted pair cable. As another example, the dielectric material 1003 may be a plastic material. The first and second conductors 1000, 1002 may form a coaxial structure in which the plastic dielectric material 1003 separates the first and second conductors 1000, 1002. As another example, the first and second conductors 1000, 1002 may be configured as planar strips.

The first conductor 1000 includes a first terminating end 1012 and a second terminating end 1016 that terminates at the interface. The first terminating end 1012 is coupled to the coupling electronics portion 603. The first terminating end 1012 may also be referred to herein as a "drive end." The second terminating end 1016 is also referred to herein as a "second drive end."

The second conductor 1002 includes a first terminating end 1020 and a second terminating end 1024 that terminates at the interface. The first terminating end 1020 is coupled to the coupling electronics portion 603. The first terminating end 1020 may also be referred to herein as a "drive end." The second terminating end 1024 is also referred to herein as a "second drive end."

The loop portion 601 of the RF coil 1001 is coupled to coupling electronics portion 603. The coupling electronics portion 603 may be the same coupling electronics described above with respect to FIGS. 6 and 9, and hence like reference numbers are given to like components and further description is dispensed with.

As appreciated by FIGS. 9 and 10, the two parallel conductors including the loop portion of an RF coil may each be continuous conductors, as illustrated in FIG. 10, or one or both of the conductors may be non-continuous, as illustrated in FIG. 9. For example, both conductors shown in FIG. 9 may include cuts, resulting in each conductor being formed of/by two segments. The resulting space between conductor segments may be filled with the dielectric material that encapsulates and surrounds the conductors. The two cuts may be positioned at different locations, e.g., one cut at 135° and the other cut at 225° (relative to where the loop portion interfaces with the coupling electronics). By including discontinuous conductors, the resonance frequency of the coil may be adjusted relative to a coil that includes continuous conductors. In an example, an RF coil that includes two continuous parallel conductors encapsulated and separated by a dielectric, the resonance frequency may be a smaller, first resonance frequency. If that RF coil instead includes one discontinuous conductor (e.g., where one of the conductors is cut and filled with the dielectric material) and one continuous conductor, with all other parameters (e.g., conductor wire gauge, loop diameter, spacing between conductors, dielectric material) being the same, the resonance frequency of the RF coil may be a larger, second resonance frequency. In this way, parameters of the loop portion, including conductor wire gauge, loop diameter, spacing between conductors, dielectric material selection and/or thickness, and conductor segment number and lengths, may be adjusted to tune the RF coil to a desired resonance frequency.

Figure 11:
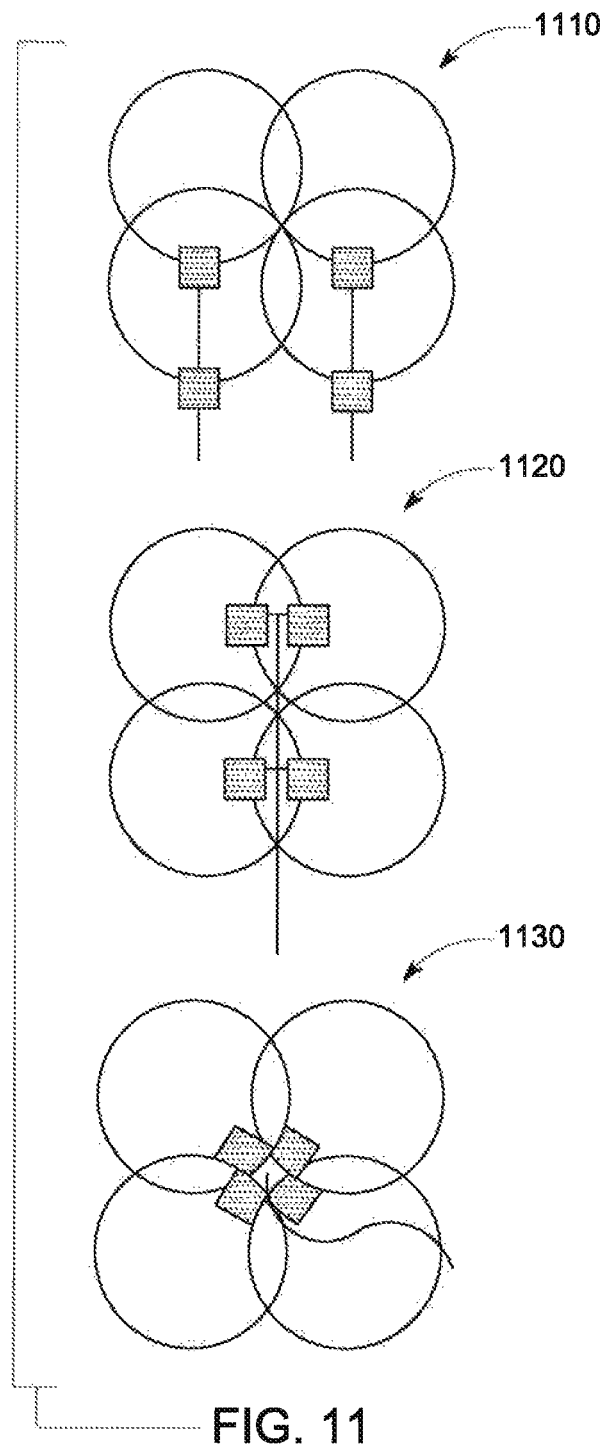
FIG. 11 shows a plurality of RF coil array configurations for the MRI system of FIG. 1, in accordance with exemplary embodiments.

The RF coils presented above with respect to FIG. 6 and FIGS. 9-10 may be utilized in order to receive MR signals during an MR imaging session. As such, the RF coils of FIG. 6 and FIGS. 9-10 may be non-limiting examples of RF coil unit 14 of FIG. 1 (and may be similar to RF coils included by RF coil unit 14, posterior RF coil arrays 202, 420, and/or 466, and/or head and neck RF coil arrays 204, 404, and/or 456, described above) and may be configured to be coupled to a downstream component of the MRI system, such as a processing system. The RF coils of FIG. 6 and FIGS. 9-10 may be present in an array of RF coils having various configurations. FIG. 11, described in more detail below, illustrates various example configurations of RF coils and accompanying coil-interfacing cables, similar to the RF coils described above with respect to FIG. 6 and FIGS. 9-10.

FIG. 11 shows different arrangements for an RF coil array. First RF coil array 1110 includes a coil loop and an electronics unit coupled to each coil, and a coil-interfacing cable connected to and extending from each coupling electronics unit. Accordingly, RF coil array 1110 includes four coil loops, four electronics units, and four coil-interfacing cables. Second RF coil array 1120 includes a separate electronics unit for each coil loop, with each electronics unit coupled to a respective coil-interfacing cable. Array 1120 includes four coil loops, four electronics units, and four coil-interfacing cables that are bundled together in a single grouping of four coil-interfacing cables, and may be referred to as an integrated balun cable harness. For example, the two coil-interfacing cables coupled to the two top electronics units are bundled together, and they are bundled with two interfacing cables from the two bottom electronics units. Third RF coil array 1130 includes a separate electronics unit for each coil loop, with each electronics unit coupled to a respective coil-interfacing cable. Array 1130 includes four coil loops, four electronics units, and four coil-interfacing cables that are bundled together in a single grouping of four coil-interfacing cables, and may be referred to as an integrated balun cable harness. For example, each coil-interfacing cable coupled to a respective electronics unit may combine into one overall coil-interfacing cable, also referred to as a cable assembly.

The individual coupling electronics units may be housed in a common electronics housing in some examples. Each coil loop of the coil array may have respective coupling electronics unit (e.g., a decoupling circuit, impedance inverter circuit, and pre-amplifier) housed in the housing. In some examples, the common electronics housing may be detachable from the coil loop or RF coil array. In particular, if the individual coupling electronics are configured as in the RF coil array 1130 of FIG. 11, the electronics may be placed in a separable assembly and disconnected from the RF coil array. A connector interface could be placed at, for example, the junctions between the conductor loop portions (e.g., the drive ends described above) and the coupling electronics for each individual coupling electronics unit.

The conductor wires and coil loops used in the RF coil or RF coil array may be manufactured in any suitable manner to get the desired resonance frequency for a desired RF coil application. The desired conductor wire gauge, such as twenty-eight (28) or thirty (30) American Wire Gauge (AWG) or any other desired wire gauge may be paired with a parallel conductor wire of the same gauge and encapsulated with a dielectric material using an extrusion process or a three-dimensional (3D) printing or additive manufacturing process. This manufacturing process may be environmentally friendly with low waste and low cost.

Thus, the RF coil described herein includes a twin lead conductor wire loop encapsulated in a pTFE dielectric that may have no cuts or with at least one cut in at least one of the two parallel conductor wires and a miniaturized coupling electronics PCB coupled to each coil loop (e.g., very small coupling electronics PCB approximately the sizer of two (2) $cm^2$ or smaller). The PCBs may be protected with a conformal coating or an encapsulation resin. In doing so, traditional components are eliminated and capacitance is "built in" the integrated capacitor (INCA) coil loops. Interactions between coil elements are reduced or eliminated. The coil loops are adaptable to a broad range of MR operating frequencies by changing the gauge of conductor wire used, spacing between conductor wires, loop diameters, loop shapes, and the number and placement of cuts in the conductor wires.

The coil loops are transparent in PET/MR applications, aiding dose management and signal-to-noise ratios (SNR). The miniaturized coupling electronics PCB includes decoupling circuitry, impedance inverter circuitry with impedance matching circuitry and an input balun, and a pre-amplifier. The pre-amplifier sets new standards in coil array applications for lowest noise, robustness, and transparency. The pre-amplifier provides active noise cancelling to reduce current noise, boost linearity, and improve tolerance to varying coil loading conditions. Additionally, as explained in more detail below, a cable harness with baluns for coupling each of the miniaturized coupling electronics PCBs to the RF coil array connector that interfaces with the MRI system may be provided.

The RF coil described herein is exceptionally lightweight, and may weigh less than ten (10) grams per coil element versus forty-five (45) grams per coil element with General Electric Company's Geometry Embracing Method (GEM) suite of flexible RF coil arrays. For example, a 16-channel RF coil array according to the disclosure may weigh less than 0.5 kg. The RF coil described herein is exceptionally flexible and durable as the coil is extremely simple with very few rigid components to damage and allowing floating overlaps. The RF coil described herein is exceptionally low cost, e.g., greater than a ten times reduction from current technology. For example, a 16-channel RF coil array could include components and materials of less than $50. The RF coil described herein does not preclude current packaging or emerging technologies and could be implemented in RF coil arrays that do not need to be packaged or attached to a former, or implemented in RF coil arrays that are attached to flexible formers as flexible RF coil arrays or attached to rigid formers as rigid RF coil arrays.

The combination of an INCA coil loop and associated coupling electronics is a single coil element, which is functionally independent and electrically immune to its surrounding environment or neighboring coil elements. As a result, the RF coil described herein performs equally well in low and high-density coil array applications. The exceptional isolation between coil elements allows the overlap between coil elements to be maximized without degrading performance across coil elements. This allows for a higher density of coil elements than is possible with traditional RF coil array designs.

In some examples, the RF coils included by the RF coil unit 14, posterior RF coil arrays 202, 420, and/or 466, and/or head and neck RF coil arrays 204, 404, and/or 456 (as described above) may be positioned in a relative arrangement similar to the configurations shown by FIG. 11. For example, the RF coils included by the posterior RF coil array 202 may be electrically coupled together as one or more sets (e.g., sub-arrays) of RF coils, and the one or more sets may include the RF coils in arrangements similar to those shown by FIG. 11 (e.g., array 1110, array 1120, and/or array 1130).

Figure 12:
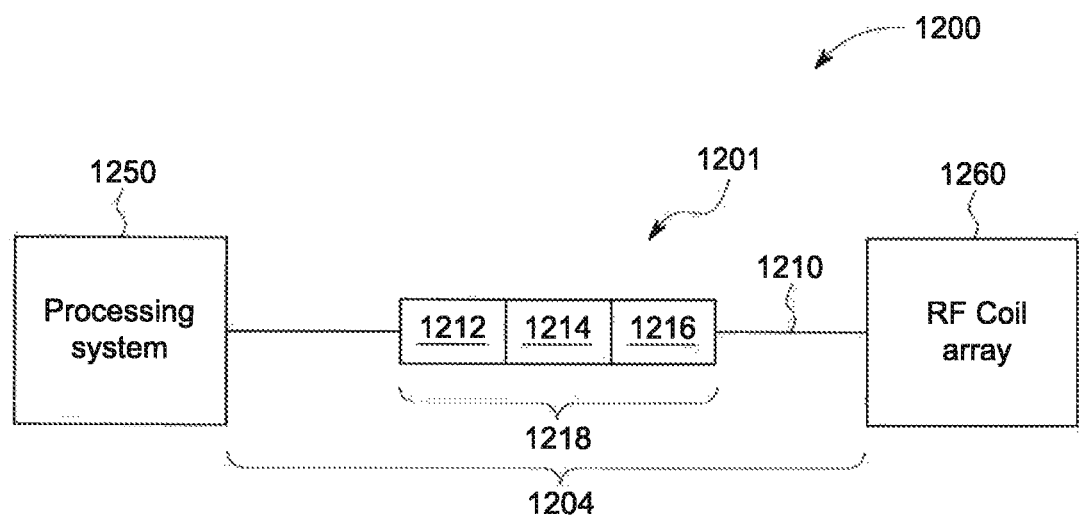
FIG. 12 schematically shows a RF coil array interfacing cable including a plurality of continuous and/or contiguous common mode traps positioned between a processing system and a RF coil array of the MRI system of FIG. 1, in accordance with an exemplary embodiment.

FIG. 12 illustrates a block schematic diagram of a continuous common mode trap assembly 1200 formed in accordance with various embodiments. The common mode trap assembly 1200 may be configured as a transmission cable 1201 configured for transmission of signals between a processing system 1250 and an RF coil array of an MRI system (RF coil unit 14, posterior RF coil arrays 202, 420, and/or 466, and/or head and neck RF coil arrays 204, 404, and/or 456). Transmission cable 1201 is a non-limiting example of RF coil array interfacing cable 612, processing system 1250 is a non-limiting example of controller unit 610, and RF coil array 1260 is a non-limiting example of a plurality RF coils such as RF coil 602 having a plurality of coupling electronics portions such as coupling electronics portion 603 of FIG. 6.

In the illustrated embodiment, the transmission cable 1201 (or RF coil array interfacing cable) includes a central conductor 1210 and plural common mode traps 1212, 1214, 1216. It may be noted that, while the common mode traps 1212, 1214, and 1216 are depicted as distinct from the central conductor 1210, in some embodiments, the common mode traps 1212, 1214, 1216 may be integrally formed with or as a part of the central conductor 1210.

The central conductor 1210 in the illustrated embodiment has a length 1204, and is configured to transmit a signal between the RF coil array 1260 and at least one processor of an MRI system (e.g., processing system 1250). The central conductor 1210 may include one or more of a ribbon conductor, a wire, or a coaxial cable bundle, for example. The length 1204 of the depicted central conductor 1210 extends from a first end of the central conductor 1210 (which is coupled to the processing system 1250) to a second end of the central conductor 1210 (which is coupled to the RF coil array 1260). In some embodiments, the central conductor may pass through a central opening of the common mode traps 1212, 1214, 1216.

The depicted common mode traps 1212, 1214, 1216 (which may be understood as cooperating to form a common mode trap unit 1218), as seen in FIG. 12, extend along at least a portion of the length 1204 of the central conductor 1210. In the illustrated embodiment, common mode traps 1212, 1214, 1216 do not extend along the entire length 1204. However, in other embodiments, the common mode traps 1212, 1214, 1216 may extend along the entire length 1204, or substantially along the entire length 1204 (e.g., along the entire length 1204 except for portions at the end configured to couple, for example, to a processor or RF coil array). The common mode traps 1212, 1214, 1216 are disposed contiguously. As seen in FIG. 12, each of the common mode traps 1212, 1214, 1216 is disposed contiguously to at least one other of the common mode traps 1212, 1214, 1216. As used herein, contiguous may be understood as including components or aspects that are immediately next to or in contact with each other. For example, contiguous components may be abutting one another. It may be noted that in practice, small or insubstantial gaps may be between contiguous components in some embodiments. In some embodiments, an insubstantial gap (or conductor length) may be understood as being less than 1/40th of a wavelength of a transmit frequency in free space. In some embodiments, an insubstantial gap (or conductor length) may be understood as being two (2) centimeters or less. Contiguous common mode traps, for example, have no (or insubstantial) intervening gaps or conductors therebetween that may be susceptible to induction of current from a magnetic field without mitigation provided by a common mode trap.

For example, as depicted in FIG. 12, the common mode trap 1212 is contiguous to the common mode trap 1214, the common mode trap 1214 is contiguous to the common mode trap 1212 and the common mode trap 1216 (and is interposed between the common mode trap 1212 and the common mode trap 1216), and the common mode trap 1216 is contiguous to the common mode trap 1214. Each of the common mode traps 1212, 1214, 1216 are configured to provide an impedance to the receive transmitter driven currents of an MRI system. The common mode traps 1212, 1214, 1216 in various embodiments provide high common mode impedances. Each common mode trap 1212, 1214, 1216, for example, may include a resonant circuit and/or one or more resonant components to provide a desired impedance at or near a desired frequency or within a target frequency range. It may be noted that the common mode traps 1212, 1214, 1216 and/or common mode trap unit 1218 may also be referred to as chokes or baluns by those skilled in the art.

In contrast to systems having separated discrete common mode traps with spaces therebetween, various embodiments (e.g., the common mode trap assembly 1200) have a portion over which common mode traps extend continuously and/or contiguously, so that there are no locations along the portion for which a common mode trap is not provided. Accordingly, difficulties in selecting or achieving particular placement locations of common mode traps may be reduced or eliminated, as all locations of interest may be included within the continuous and/or contiguous common mode trap. In various embodiments, a continuous trap portion (e.g., common mode trap unit 1218) may extend along a length or portion thereof of a transmission cable.

The continuous mode trap portion may be formed of contiguously-joined individual common mode traps or trap sections (e.g., common mode traps 1212, 1214, 1216). Further, contiguous common mode traps may be employed in various embodiments to at least one of lower the interaction with coil elements, distribute heat over a larger area (e.g., to prevent hot spots), or help ensure that blocking is located at desired or required positions. Further, contiguous common mode traps may be employed in various embodiments to help distribute voltage over a larger area. Additionally, continuous and/or contiguous common mode traps in various embodiments provide flexibility. For example, in some embodiments, common mode traps may be formed using a continuous length of conductor(s) (e.g., outer conductors wrapped about a central conductor) or otherwise organized as integrally formed contiguous sections. In various embodiments, the use of contiguous and/or continuous common mode traps (e.g., formed in a cylinder) provide for a range of flexibility over which flexing of the assembly does not substantially change the resonant frequency of the structure, or over which the assembly remains on frequency as it is flexed.

It may be noted that the individual common mode traps or sections (e.g., common mode traps 1212, 1214, 1216) in various embodiments may be constructed or formed generally similarly to each other (e.g., each trap may be a section of a length of tapered wound coils), but each individual trap or section may be configured slightly differently than other traps or sections. For example, in some embodiments, each common mode trap 1212, 1214, 1216 is tuned independently. Accordingly, each common mode trap 1212, 1214, 1216 may have a resonant frequency that differs from other common mode traps of the same common mode trap assembly 1200.

Alternatively, or additionally, each common mode trap may be tuned to have a resonant frequency near an operating frequency of the MRI system. As used herein, a common mode trap may be understood as having a resonant frequency near an operating frequency when the resonant frequency defines or corresponds to a band that includes the operating frequency, or when the resonant frequency is close enough to the operating frequency to provide on-frequency blocking, or to provide a blocking impedance at the operating frequency.

Further additionally or alternatively, each common mode trap may be tuned to have a resonant frequency below an operating frequency of the MRI system (or each common mode trap may be tuned to have resonant frequency above an operating frequency of the MRI system). With each trap having a frequency below (or alternatively, with each trap having a frequency above) the operating frequency, the risk of any of the traps canceling each other out (e.g., due to one trap having a frequency above the operating frequency and a different trap having a frequency below the operating frequency) may be eliminated or reduced. As another example, each common mode trap may be tuned to a particular band to provide a broadband common mode trap assembly.

In various embodiments, the common mode traps may have a two-dimensional (2D) or three-dimensional (3D) butterfly configuration to counteract magnetic field coupling and/or local distortions.

Figure 13:
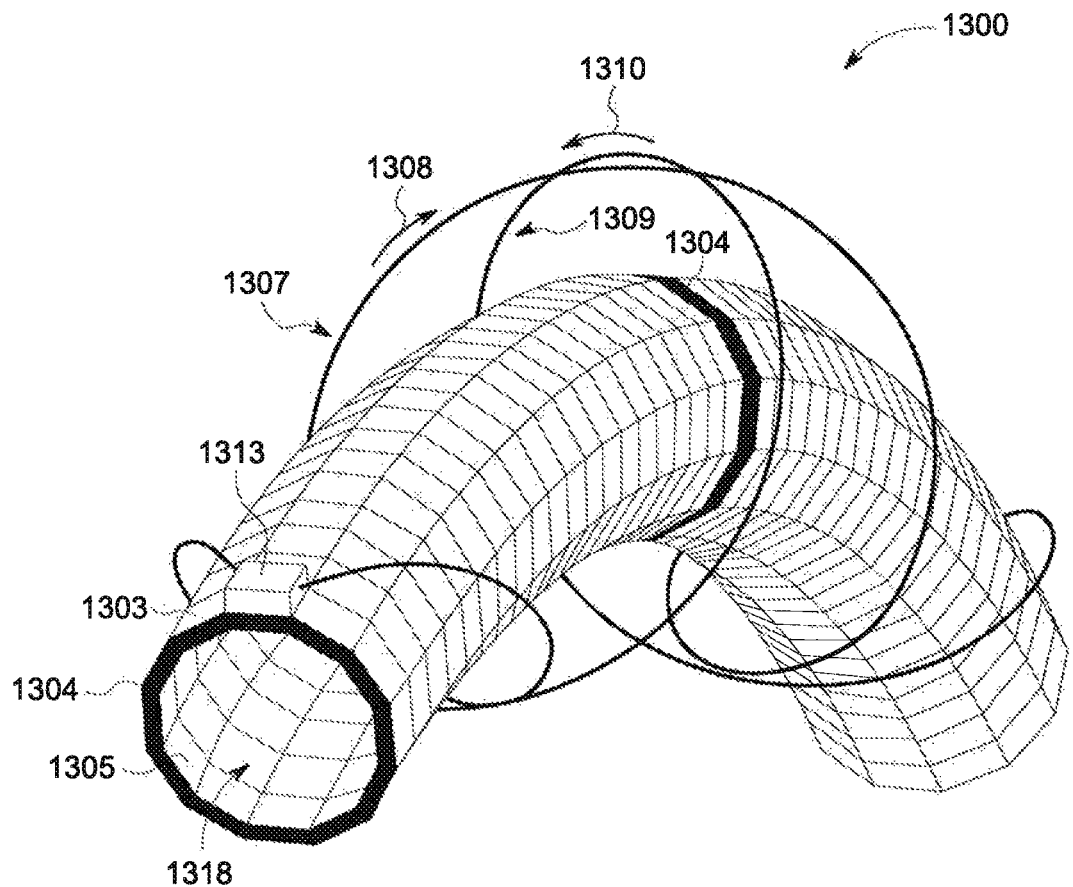
FIGS. 13 and 14 each schematically show RF coil array interfacing cables including a plurality of continuous and/or contiguous common mode traps for use with the MRI system of FIG. 1, in accordance with an exemplary embodiment.

FIG. 13 is a perspective view of an RF coil array interfacing cable 1300 including a plurality of continuous and/or contiguous common mode traps according to an embodiment of the disclosure. The RF coil array interfacing cable 1300 includes an outer sleeve or shield 1303 (which may be referred to herein as an outer shielding), a dielectric spacer 1304, an inner sleeve 1305, a first common mode trap conductor 1307, and a second common mode trap conductor 1309, and may be referred to herein as a common mode trap.

The first common mode trap conductor 1307 is wrapped in a spiral about the dielectric spacer 1304, or wrapped in a spiral at a tapering distance from a central conductor (not shown) disposed within the bore 1318 of the RF coil array interfacing cable 1300, in a first direction 1308. Further, the second common mode trap conductor 1309 is wrapped in a spiral about the dielectric spacer 1304, or wrapped in a spiral at a tapering distance from the central conductor disposed within the bore 1318, in a second direction 1310 that is opposite to the first direction 1308. In the illustrated embodiment, the first direction 1308 is clockwise and the second direction 1310 is counter-clockwise. The first common mode trap conductor 1307 and second common mode trap conductor 1309 may be referred to herein as counterwound conductors or outer conductors.

The conductors 1307 and 1309 of the RF coil array interfacing cable 1300 may include electrically-conductive material (e.g., metal) and may be shaped as ribbons, wires, and/or cables, for example. In some embodiments, the counterwound or outer conductors 1307 and 1309 may serve as a return path for a current passing through the central conductor. Further, in various embodiments, the counterwound conductors 1307 and 1309 may cross each other orthogonally (e.g., a center line or path defined by the first common mode trap conductor 1307 is perpendicular to a center line or path defined by the second common mode trap conductor 1309 as the common mode trap conductors cross paths) to eliminate, minimize, or reduce coupling between the common mode trap conductors.

It may be further noted that in various embodiments the first common mode trap conductor 1307 and the second common mode trap conductor 1309 are loosely wrapped about the dielectric spacer 1304 to provide flexibility and/or to reduce any binding, coupling, or variation in inductance when the RF coil array interfacing cable 1300 is bent or flexed. It may be noted that the looseness or tightness of the counterwound outer conductors may vary by application (e.g., based on the relative sizes of the conductors and dielectric spacer, the amount of bending or flexing that is desired for the common mode trap, or the like). Generally, the outer or counterwound conductors should be tight enough so that they remain in the same general orientation about the dielectric spacer 1304, but loose enough to allow a sufficient amount of slack or movement during bending or flexing of the RF coil array interfacing cable 1300 to avoid, minimize, or reduce coupling or binding of the counterwound outer conductors.

In the illustrated embodiment, the outer shielding 1303 is discontinuous in the middle of the RF coil array interfacing cable 1300 to expose a portion of the dielectric spacer 1304 which in some embodiments is provided along the entire length of the RF coil array interfacing cable 1300. The dielectric spacer 1304, may be made of/from, as a non-limiting example, Teflon or another dielectric material. The dielectric spacer 1304 functions as a capacitor and thus may be tuned or configured to provide a desired resonance. It should be appreciated that other configurations for providing capacitance to the RF coil array interfacing cable 1300 are possible, and that the illustrated configurations are exemplary and non-limiting. For example, discrete capacitors may alternatively be provided to the RF coil array interfacing cable 1300.

Further, the RF coil array interfacing cable 1300 includes a first post 1313 and a second post (not shown) to which the first common mode trap conductor 1307 and the second common mode trap conductor 1309 are fixed. To that end, the first post 1313 and the second post are positioned at the opposite ends of the common mode trap, and are fixed to the outer shielding 1303. The first post 1313 and the second post ensure that the first and second common mode trap conductors 1307 and 1309 are positioned close to the outer shielding 1303 at the ends of the RF coil array interfacing cable 1300, thereby providing a tapered butterfly configuration of the counterwound conductors as described further herein.

The tapered butterfly configuration includes a first loop formed by the first common mode trap conductor 1307 and a second loop formed by the second common mode trap conductor 1309, arranged so that an induced current (a current induced due to a magnetic field) in the first loop and an induced current in the second loop 1309 cancel each other out. For example, if the field is uniform and the first loop and the second loop have equal areas, the resulting net current will be zero. The tapered cylindrical arrangement of the first and second loops provides improved flexibility and consistency of resonant frequency during flexing relative to two-dimensional arrangements conventionally used in common mode traps.

Generally, a tapered butterfly configuration as used herein may be used to refer to a conductor configuration that is flux cancelling, for example including at least two similarly sized opposed loops that are symmetrically disposed about at least one axis and are arranged such that currents induced in each loop (or group of loops) by a magnetic field tends to cancel out currents induced in at least one other loop (or group of loops). For example, with reference to FIG. 12, in some embodiments, counterwound conductors (e.g., conductors wound about a central member and/or axis in opposing spiral directions) may be spaced a distance radially from the central conductor 1210 to form the common mode traps 1212, 1214, 1216. As depicted in FIG. 13, the radial distance may be tapered towards the end of the common mode traps to reduce or altogether eliminate fringe effects. In this way, the common mode traps 1212, 1214, 1216 may be continuously or contiguously positioned without substantial gaps therebetween.

Figure 14:
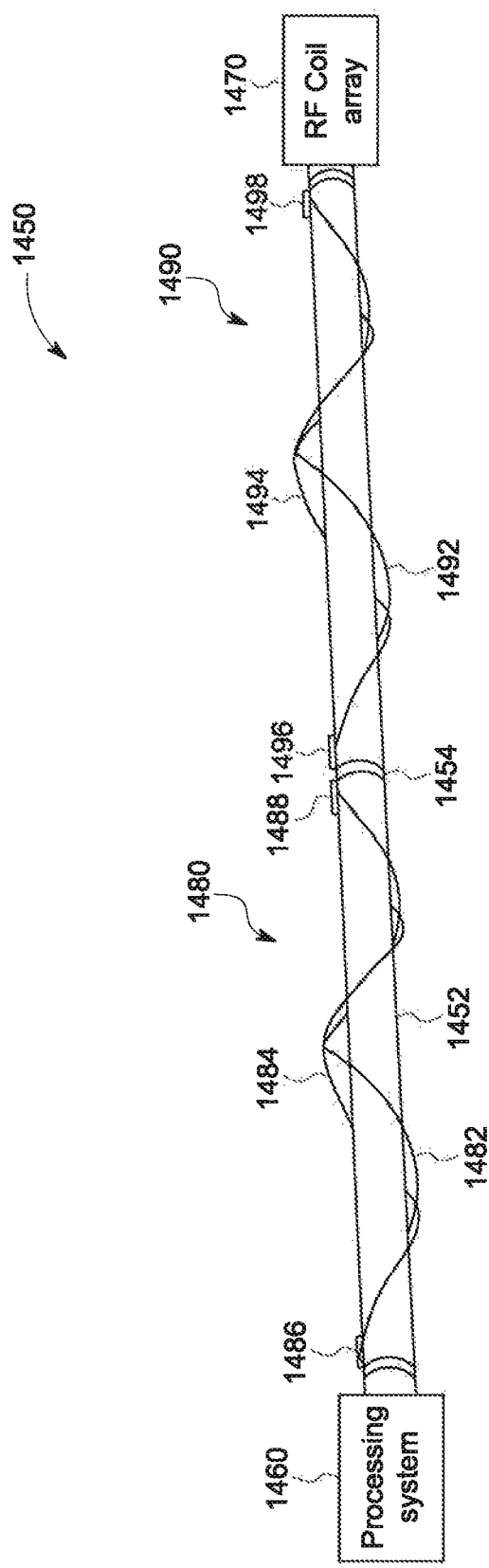

The tapered spiral configuration of the common mode trap conductors described herein above is particularly advantageous when multiple common mode trap conductors are contiguously disposed in a common mode trap assembly. As an illustrative example, FIG. 14 is a perspective view of an RF coil array interfacing cable 1450 including a plurality of continuous and/or contiguous common mode traps coupling an RF coil unit 1470 to a processing system 1460. RF coil array interfacing cable 1450 includes a first common mode trap 1480 and a second common mode trap 1490 positioned adjacent to each other on a central conductor 1452.

The first common mode trap 1480 includes a first common mode trap conductor 1482 and a second common mode trap conductor 1484 counterwound in a tapered spiral configuration. To that end, the first and second conductors 1482 and 1484 are fixed to posts 1486 and 1488. It should be noted that the posts 1486 and 1488 are aligned on a same side of the common mode trap 1480.

Similarly, the second common mode trap 1490 includes a third common mode trap conductor 1492 and a fourth common mode trap conductor 1494 counterwound in a tapered spiral configuration and fixed to posts 1496 and 1498. It should be noted that the posts 1496 and 1498 are aligned on a same side of the common mode trap 1490.

As depicted, the common mode traps 1480 and 1490 are separated by a distance, thereby exposing the central conductor 1452 in the gap 1454 between the common mode traps. Due to the tapering spiral configuration of the common mode trap conductors of the common mode traps, the gap 1454 can be minimized or altogether eliminated in order to increase the density of common mode traps in a common mode trap assembly without loss of impedance functions of the common mode traps. That is, the distance can be made arbitrarily small such that the common mode traps are in face-sharing contact, given the tapered spiral configuration.

It should be appreciated that while the RF coil array interfacing cable 1450 includes two common mode traps 1480 and 1490, in practice an RF coil array interfacing cable may include more than two common mode traps.

Further, the common mode traps 1480 and 1490 of the RF coil array interfacing cable 1450 are aligned such that the posts 1486, 1488, 1496, and 1498 are aligned on a same side of the RF coil array interfacing cable. However, in examples where cross-talk between the common mode traps may be possible, for example if the tapering of the counterwound conductors is more severe or steep, the common mode traps may be rotated with respect to one another to further reduce fringe effects and/or cross-talk between the traps.

Additionally, other common mode trap or balun configurations are possible. For example, the exterior shielding of each common mode trap may be trimmed such that the common mode traps can be overlapped or interleaved, thus increasing the density of the common mode traps.

In some examples, the RF coils described above with reference to FIG. 6 and FIGS. 9-14 may have one of a plurality of different resonant frequencies, and/or one or more RF coils of the RF coil arrays described above may have different resonant frequencies relative to one or more other RF coils. For example, the RF coils described above with reference to FIG. 7 (e.g., RF coils adapted for respiratory measurement) may have a different resonant frequency than the RF coils adapted for imaging a head and/or neck of a patient (e.g., the RF coils included by head and neck RF coil array 404). In one example, a gauge of the loop portion of the RF coils, a spacing between wires of the RF coils, a diameter of the loop portion, and/or a number and/or arrangement of cuts in the wires of the RF coils may alter the resonant frequency of the RF coils. RF coils having an appropriate resonant frequency may be selected for various MRI systems (e.g., systems in which the static magnetic field has a specified magnitude, such as 1.5 Tesla, 3 Tesla, 7 Tesla, etc.) and/or may be selected according to an anatomical feature to be imaged by the MRI system (e.g., RF coils for imaging a posterior of the patient may have a different resonant frequency than RF coils for imaging an anterior of the patient).

By configuring the RF coil arrays according to the examples described above, an imaging quality of the RF coil arrays may be increased. For example, by positioning the RF coils of the RF coil arrays within the grooves formed by the compressible material of the RF coil arrays, the RF coils may be positioned closer to the body of the patient (e.g., proximate to the top surface of the RF coil array). By shaping the head and neck RF coil array to partially surround the head of the patient, the RF coils of the head and neck RF coil array may be positioned closer to the head of the patient, increasing a signal-to-noise ratio of electrical signals transmitted to the MRI system by the head and neck RF coil array.

The head and neck RF coil array further includes the straps shaped to surround the neck of the patient in order to increase an imaging quality of the neck region of the patient. The posterior RF coil array may include RF coils of different diameters in order to further increase the imaging quality of the posterior RF coil array (e.g., the signal-to-noise ratio of the posterior RF coil array), and in some examples, one or more RF coils of the posterior RF coil array may be configured to operate at a different resonance frequency in order to measure or track a respiratory motion of the patient. A plurality of extensions including RF coils disposed therein and/or a pelvic RF coil array may be detachably or fixedly coupled to the posterior RF coil array in order to increase an amount of the body of the patient that may be imaged by the MRI system.

Additionally, by forming the RF coil arrays according to the examples described above, the RF coil arrays may be retrofitted to couple with less flexible RF coil arrays, such as those including in rigid PCB components and plastic formers. In this way, the RF coil arrays described herein may be utilized with a variety of different MRI systems, and by configuring the RF coil arrays described herein to be detachably coupled with each other, the RF coil arrays may be easily removed from the MRI system for storage, cleaning, etc.

A technical effect of the disclosure is to increase imaging quality of a MRI system by positioning the RF coils of the RF coil arrays closer to the body of the patient, for spinal imaging, head and neck imaging, and/or respiratory motion detection in some examples, via an MRI system. Another technical effect of the disclosure is to provide RF coil arrays that may be easily retrofitted to existing components of MRI systems.

Figure 15:
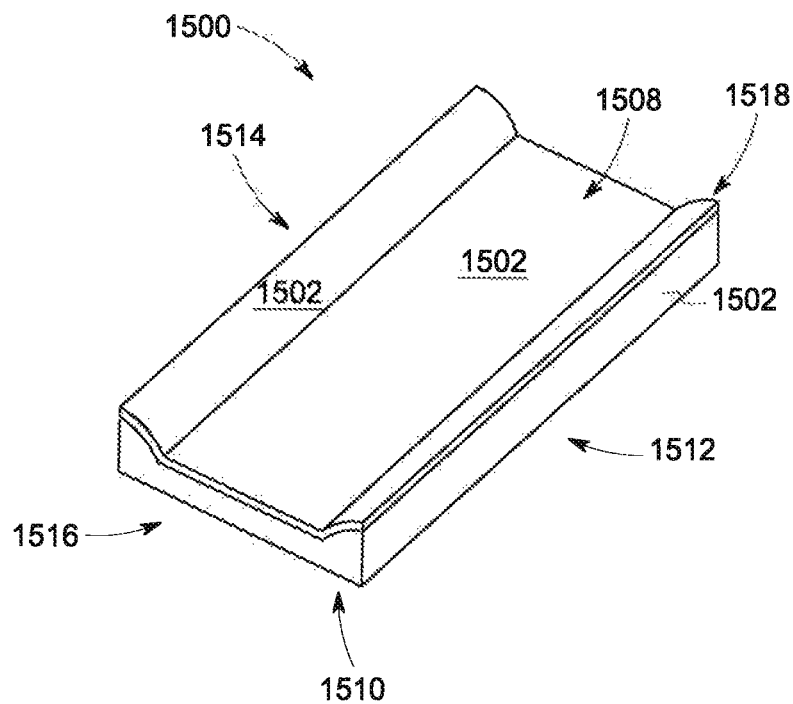
FIG. 15 is a diagram of a pad for use in the MRI system of FIG. 1, in accordance with an exemplary embodiment.
Figure 18:
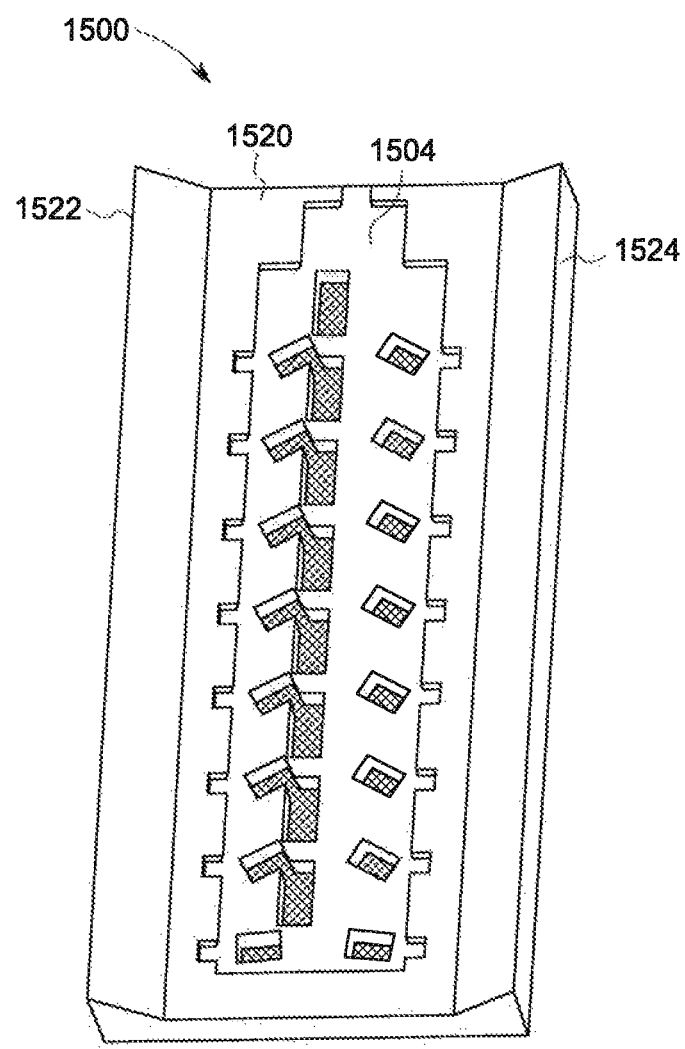
FIG. 18 is yet another diagram of the pad of FIG. 16, in accordance with an exemplary embodiment.
Figure 19:
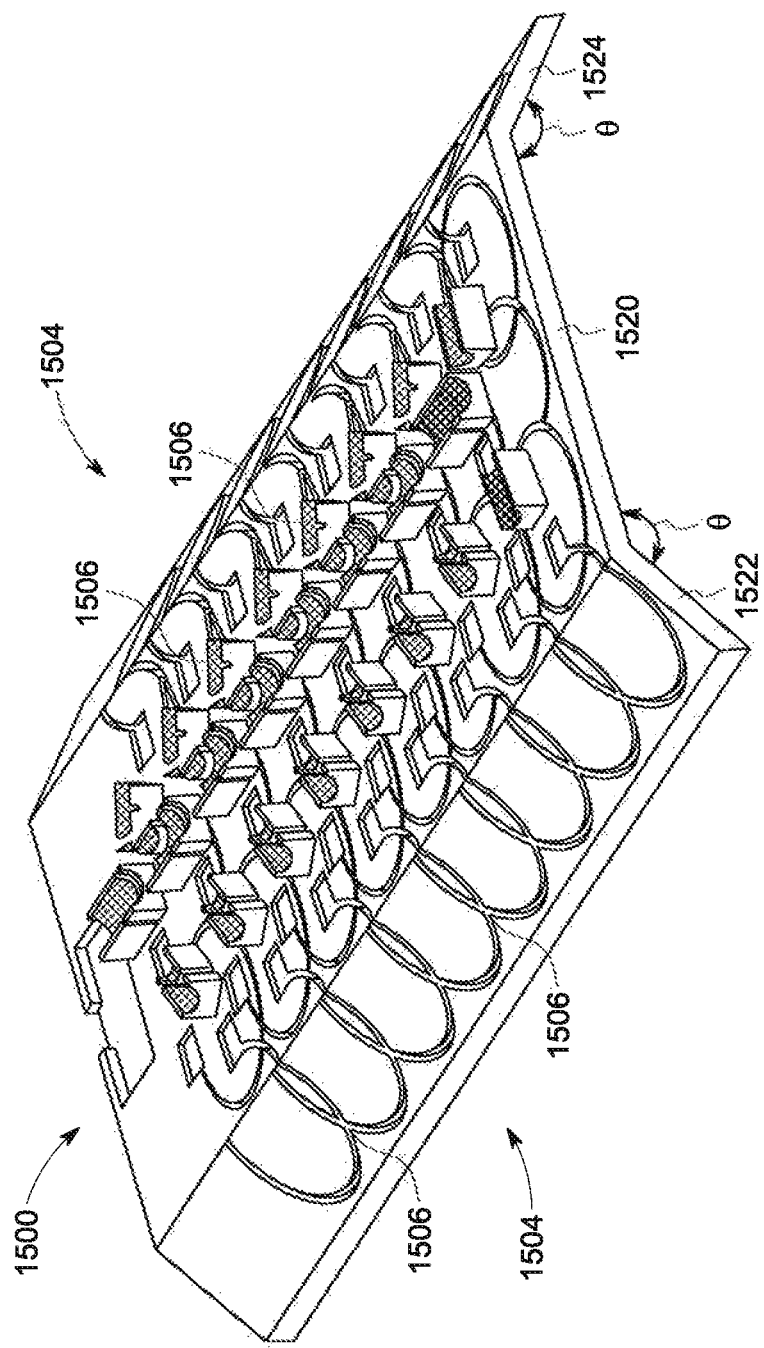
FIG. 19 is still yet another diagram of the pad of FIG. 16, in accordance with an exemplary embodiment.
Figure 20:
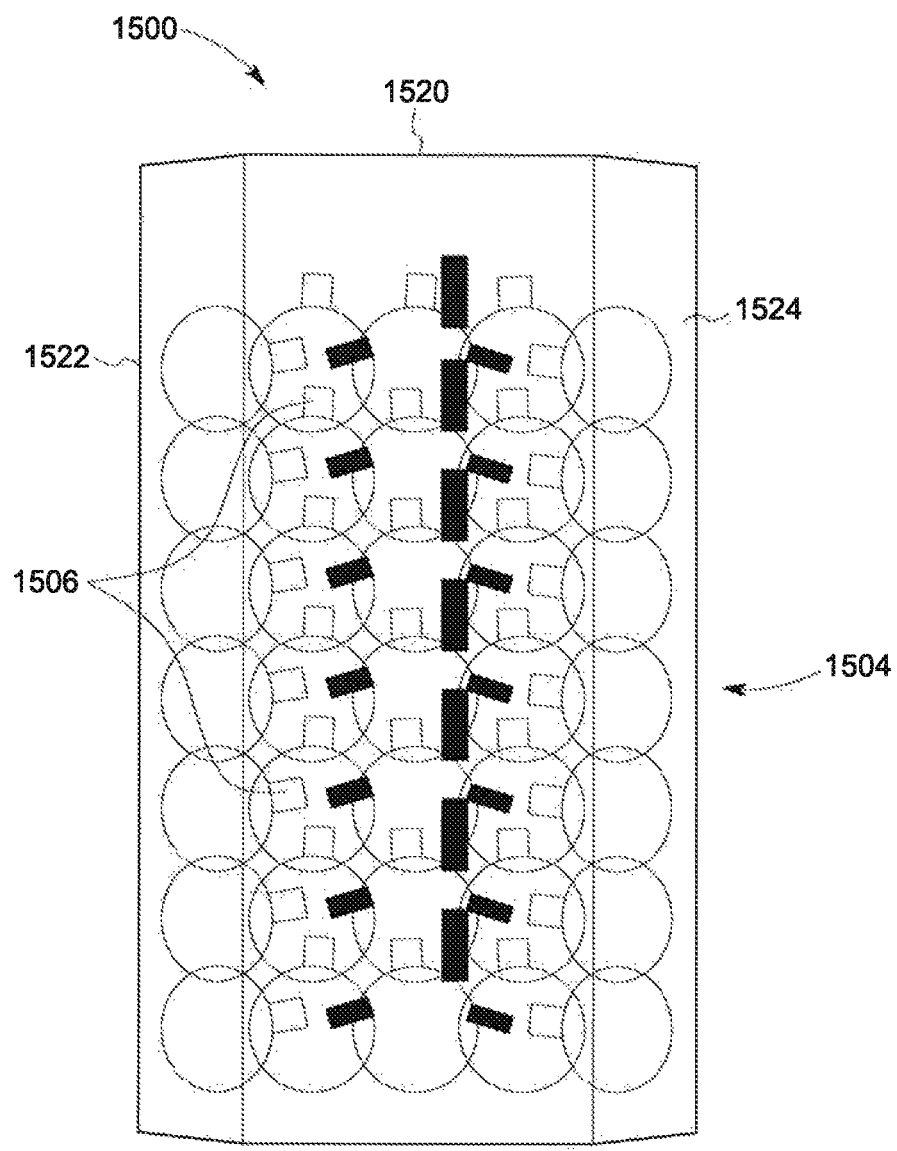
FIG. 20 is still yet another diagram of the pad of FIG. 16, in accordance with an exemplary embodiment.

Turning now to FIG. 15, a pad 1500 in accordance with another exemplary embodiment is shown. The pad 1500 includes a compressible body 1502 having a RF coil array 1504 (best seen in FIGS. 18-20) disposed therein. While pad 1500 is depicted herein as having a single array 1504, it should be understood that the pad 1500 may include two or more RF coil arrays. Similar to the coil arrays 202 and 204, in embodiments, coil array 1504 may have a plurality of RF coils 1506 (FIGS. 19 and 20) each having a distributed capacitance loop portion having two parallel wires, encapsulated and separated by a dielectric material, and a coupling electronics portion that includes a pre-amplifier (similar to the RF coil best seen in FIGS. 6, 9 and 10). As will be understood, the RF coil array 1504 adapts its shape based at least in part on a load imparted/applied on/to the compressible body 1502. In other words, the flexibility of the RF coils 1506 allows the RF coil array 1504 to conform to the shape of a patient's body resting on the compressible body 1502. In embodiments, the RF coil array 1504 may be a posterior RF coil array like RF coil array 204 (FIGS. 4A-4B).

The body 1502 may have one or more surfaces 1508, 1510, 1512, 1514, 1516, 1518, e.g., a top 1508, a bottom 1510 and four sides 1512, 1514, 1516 and 1518. The one or more surfaces 1508, 1510, 1512, 1514, 1516, 1518 may form defined edges and/or smoothly transitions into each other, e.g., rounded edges.

In embodiments, the compressible body 1502 may have a curved and/or substantially "u" shape as shown in FIG. 15.

As shown in FIGS. 16-20, in embodiments, the compressible body 1502 may include a central portion 1520 and two side portions 1522 and 1524 each extending from the central portion 1520 at an angle θ. In embodiments, θ may be between about 0° to about 135°. In certain aspects, θ may be between about 0° to about 90°. In embodiments, the curved body 1502 (FIG. 15) and/or angled side portions 1522, 1524 (FIGS. 16-20) of the pad 1500 serve to cradle the patient, which in turn, promotes proper positioning of the patient for MRI scanning. For example, as the RF coil array 1504 is disposed within the body 1502, the RF coil array 1504 is able to adapt to the shape of the patient as the body 1502 compresses/deforms to conform to the shape of the patient, such that the coils 1506 are brought closer to the patient than traditional RF coil arrays. In other words, RF coil array 1504 mimics the posterior portion of the patient, which in turn, may improve the SNR.

Figure 16:
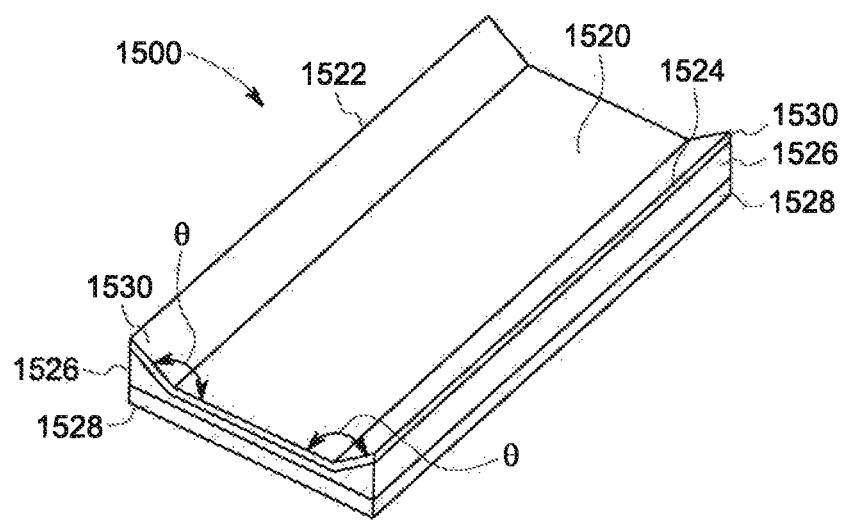
FIG. 16 is a diagram of another embodiment of the pad of FIG. 15, in accordance with an exemplary embodiment.
Figure 17:
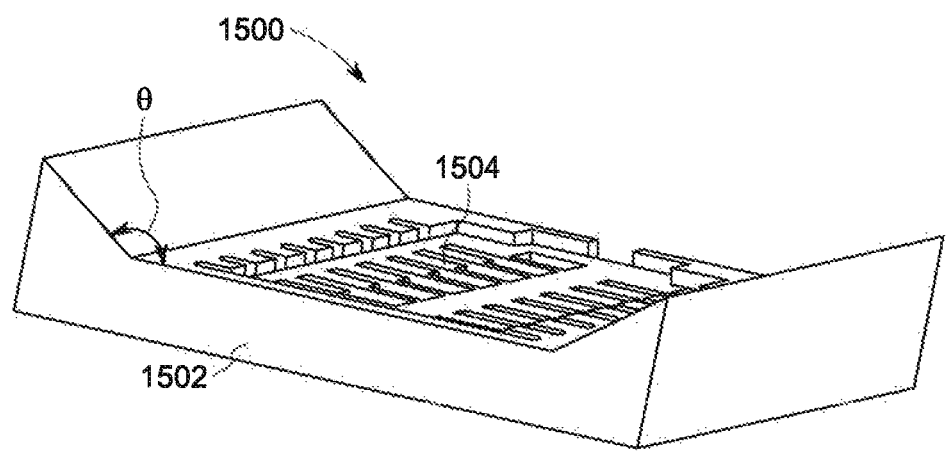
FIG. 17 is another diagram of the pad of FIG. 16, in accordance with an exemplary embodiment.

In some embodiments, the compressible body 1502 may include a top layer made of one or more sheets of flexible fabric material, such as DARTEX® fabric, and an inner layer made of memory foam or other deformable materials, similar to the structure shown in FIG. 5. The inner layer may have a plurality of annular grooves each configured to accommodate an RF coil of the RF coil array 1504, again, similar to the structure shown in FIG. 5. In some embodiments, the compressible body 1502 may include two or more 1526 and 1528 layers and/or an optional top layer 1530 as shown in FIG. 16. In such embodiments, the two or more layers 1526 and 1528 may hold/contain the RF coil array 1504 and be studier than the top layer 1530. In such embodiments, the top layer 1530 may be softer than the two or more layers 1526 and 1528 in order to provide for improved patient conformance/cradling, while the studier layers 1526, 1528 provide protection to the RF coil array 1504.

As will be further appreciated, in embodiments, the RF coil array 1504 may be operative to detect respiratory motion of a patient, as explained above with reference to FIG. 8.

By incorporating a flexible RF coil array 1504 into the body 1502 of a pad 1500, some embodiments provide for a comfortable and flexible posterior RF coil array. Further, by incorporating a curved body and/or angled side portions, some embodiments of the present invention provide for a posterior RF coil array that is specialized, i.e., particularly well suited, for infants who typically have different anatomical requirements for MRI scanning than their adult counterparts. Accordingly, some embodiments provide for an improved posterior RF coil for infants and children from age zero (0) to about four (4) or five (5) years old. Further, because the RF coil array 1504 is disposed within the body 1502, some embodiments of the present invention provide for a posterior RF coil array that is easy to use, clean and/or transport.

Figure 21:
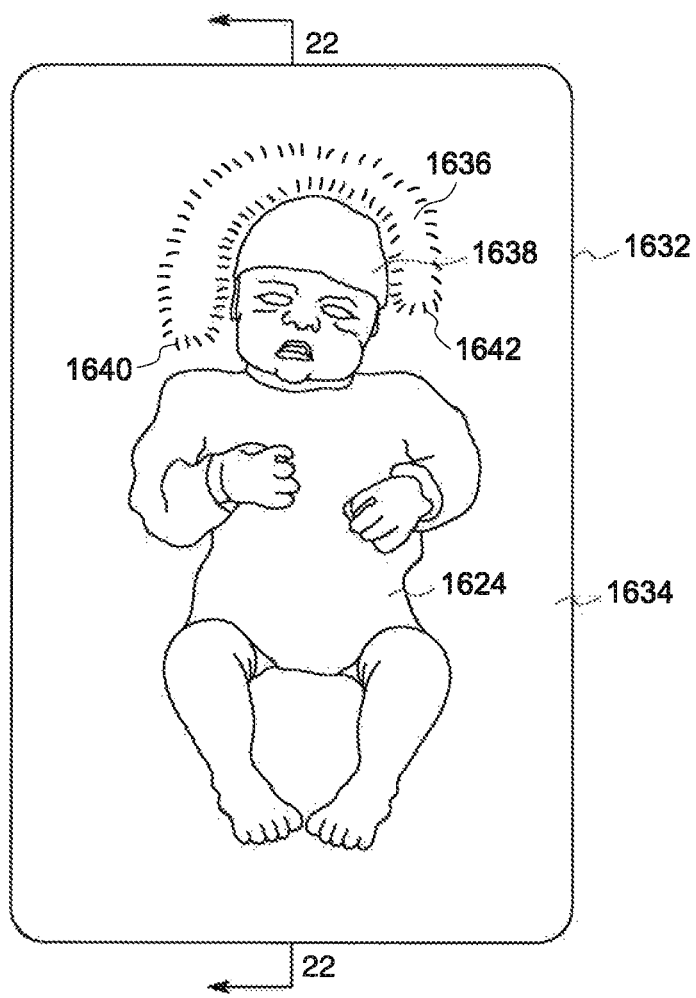
FIG. 21 is a top view of an infant patient supported on a mattress, in accordance with an exemplary embodiment.

Referring now to FIG. 21, a pad 1632 in accordance with yet another exemplary embodiment is shown. The mechanical configuration of the pad 1632 is described in U.S. application Ser. No. 15/405,479 (published as US 2018/0199731), the entirety of which is incorporated herein by reference. An infant patient 1624 is positioned on the generally planar support surface 1634 of the pad 1632. The pad 1632 includes a head support 1636 positioned to support the head 1638 of the infant patient 1624 when the infant patient 1624 is positioned on the pad 1632. In the embodiment shown in FIG. 22, the head support 1636 protrudes above the support surface 1634 and has a generally U-shaped configuration. The head support 1636 surrounds the top and sides of the head 1638 and terminates at first and second ends 1640, 1642 that are located on opposite sides of the infant head 1638. The distance between the first and second ends 1640, 1642 is selected to allow the infant head 1638 to be securely positioned between the first and second ends 1640, 1642. The head support 1636 could have shorter sides to have a semi-ring shape or the sides could be extended to form the generally U-shape shown in FIG. 21.

Figure 22:
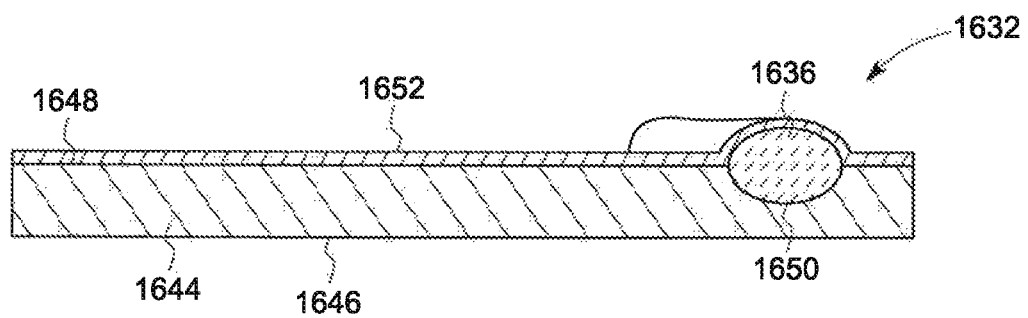
FIG. 22 is a section view taken along line 22-22 of FIG. 21, in accordance with an exemplary embodiment.

As illustrated in the section view of FIG. 22, the pad 1632 includes a base layer 1644 that is formed from foam or other type material typically used in an infant mattress. The base layer 1644 includes a bottom surface 1646 and a top surface 1648 that combine to define the thickness of the base layer 1644. In the embodiment shown, a cavity 1650 is formed in the base layer 1644 and is open to the top surface 1648.

Figure 23:
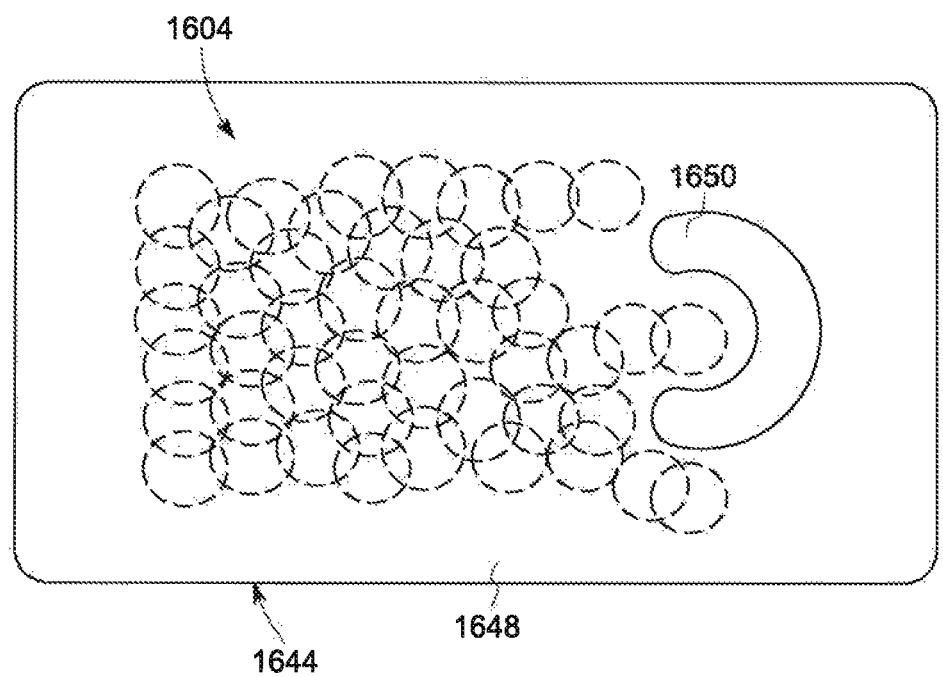
FIG. 23 is a top plan view of a base layer of the mattress of FIG. 21, in accordance with an exemplary embodiment.

FIG. 23 is a top view of only the base layer 1644 and illustrates the position of the cavity 1650 relative to the ends and sides of the base layer 1644. The cavity 1650 is recessed from the top surface 1648. The cavity 1650 has a U-shape or semi-ring shape and is located in a desired position to support the head of an infant, as was shown and described in FIG. 21.

Figure 24:
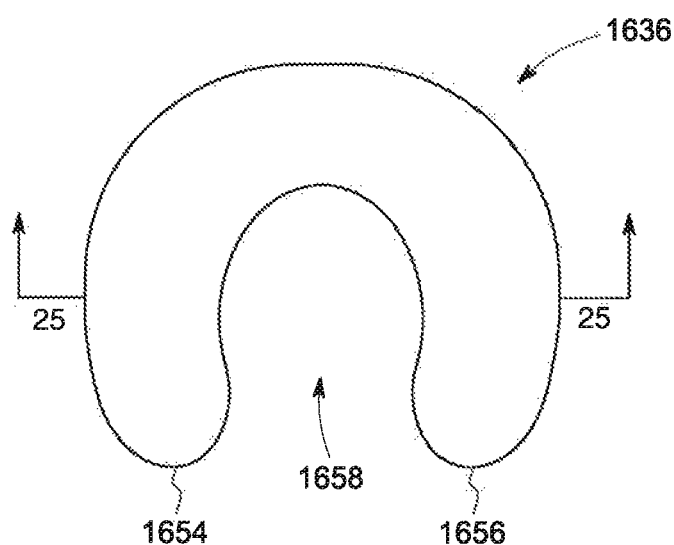
FIG. 24 is a top view of the deformable head support in the mattress of FIG. 21, in accordance with an exemplary embodiment.

Referring back to FIG. 22, the head support 1636 is shown positioned within the cavity 1650. The head support 1636 may be formed from a deformable material that is different from the material used to form the base layer 1644. FIG. 24 illustrates the head support 1636 without an infant patient on the pad 1632. Although the embodiment shown in FIG. 22 includes the cavity 1650 formed in the base layer 1644, it is contemplated that the cavity 1650 could be eliminated. In such an embodiment, the head support 1636 would rest on the top surface 1648 and would compress the foam material of the base layer 1644 to hold the base layer 1644 in place.

The pad 1632 further includes a cover layer 1652 that is positioned over both the base layer 1644 and the head support 1636 to provide a uniform and comfortable support surface for the infant patient. The cover layer 1652 can be formed from a wide variety of material, such as a woven microfiber that is both comfortable and can be easily cleaned. The cover layer 1652 is preferably somewhat elastic to move with the deformable head support 1636 as will be described in detail below. Although the cover layer 1652 is shown in the embodiment of FIG. 22, it should be understood that the cover layer 1652 could be removed while operating within a contemplated embodiment of the present disclosure.

Figure 25:
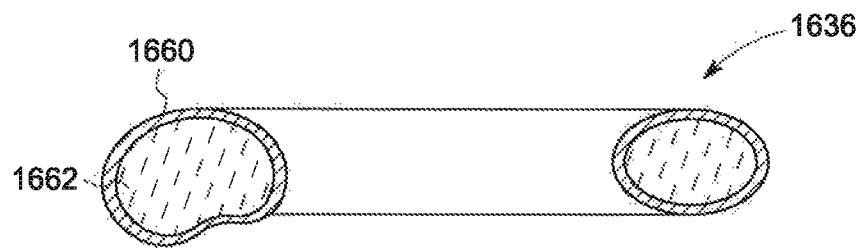
FIG. 25 is a section view taken along line 25-25 of FIG. 24, in accordance with an exemplary embodiment.

FIGS. 24 and 25 illustrate the head support 1636 removed from the mattress. The head support 1636 is a generally U-shaped or semi-ring shaped member and extends between a first end 1654 and a second end 1656. The first and second ends 1654, 1656 are spaced from each other to define an open space 1658 that can receive the neck of the infant patient.

As illustrated in FIG. 25, the head support 1636 includes an outer casing 1660 that surrounds a deformable material 1662. The outer casing 1660 can be formed from multiple materials, such as silicon, thermoplastic, neoprene or similar type material that is both flexible and durable enough to entrap the deformable material 1662. In the embodiment shown in FIG. 25, the deformable material 1662 is a gel having the required thickness such that the shape of the head support 1636 can be molded into a desired shape and the deformable material will retain the desired shape. Although various different types of gels are contemplated as being used for the deformable material 1662, it should be understood that other types of materials that can be deformed and retain a desired shape could be utilized while operating within the scope of the present disclosure. These materials could include beads formed from various materials or a highly viscous liquid.

Figure 26:
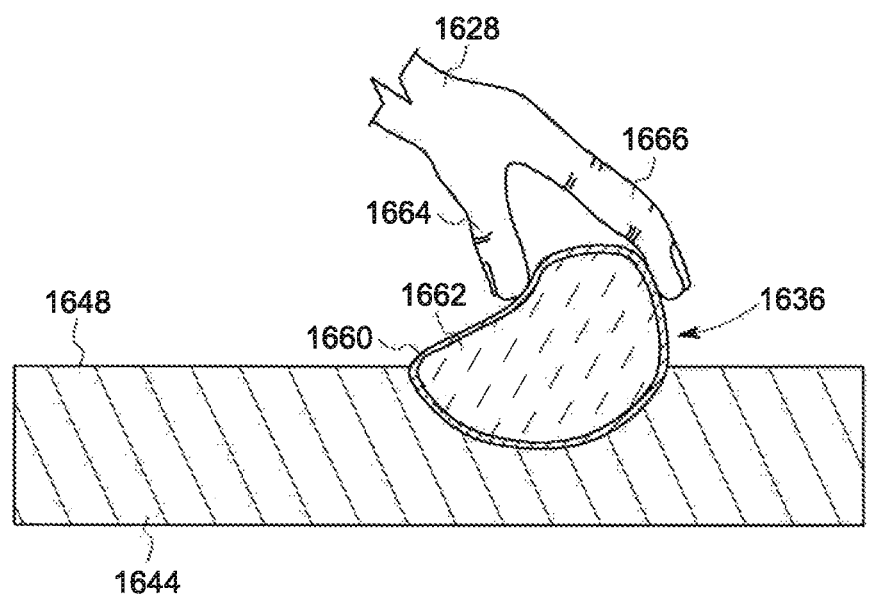
FIG. 26 is a partial section view showing the deformation of the head support of FIG. 24 by a clinician, in accordance with an exemplary embodiment.

As shown in FIG. 26, the clinician 1628 can manipulate the head support 1636 into a desired shape by using a thumb 1664 and one or more fingers 1668 to squeeze the head support 1636 into a desired shape or configuration. When squeezed, the deformable material 1662 moves within the flexible outer casing 1660 and retains the shape created by the clinician 1628. In the embodiment shown in FIG. 26, a larger portion of the deformable material 1662 is pushed away from the center of the mattress to generally increase the area for the infant's head. If the infant's head was smaller, the clinician 1628 would move the deformable material 1662 in the opposite direction. Once the clinician 1628 has molded the head support in the desired shape and configuration, the clinician 1628 can remove his or her hand and the deformable material 1662 will retain the desired shape. As can be understood, once the infant patient is removed from the mattress and the mattress is used with another infant patient, the clinician 1628 can reconfigure the shape of the head support 1636 based upon the individual infant patient.

In the embodiment shown in FIG. 26, the cover layer 1652 shown in FIG. 22 has been removed for the ease of understanding. It should be understood that the cover layer 1652 would extend over the entire base layer 1644 and be attached to the top surface 1648. The cover layer would also extend over the head support 1636 as previously described.

Additionally, similar to pad 1500 (FIGS. 15-20), the pad 1632, in embodiments, may have a RF coil array 1604 (FIG. 25), similar to RF coil array 1504, disposed therein. As will be appreciated, the RF coil array 1604 is shown in FIG. 25 in dashed lines to represent that, in embodiments, the RF coil array 1604 may be disposed within the base layer 1644. The base layer 1644 may have a plurality of grooves each configured to accommodate an RF coil of the RF coil array 1604, similar to the structure shown in FIG. 5. In some embodiments, the RF coil array 1604 may be operative to detect respiratory motion of a patient, as explained above with reference to FIG. 8.

It is to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

Accordingly, embodiments of the present invention provide for a RF coil array assembly for a MRI system. The RF coil array assembly includes a compressible body; an upper posterior RF coil array including a first plurality of RF coils embedded in the compressible body; a lower posterior RF coil array including a second plurality of RF coils embedded in the compressible body; and a head and neck RF coil array removably coupled to the upper posterior RF coil array. The head and neck RF coil array includes a third plurality of RF coils embedded in the compressible body, and one or more neck straps configured to fold over a neck of a subject to be imaged by the MRI system. Each RF coil of the first plurality of RF coils, the second plurality of RF coils, and the third plurality of RF coils includes a distributed capacitance loop portion including two distributed capacitance wire conductors. In certain embodiments, the upper posterior RF coil array is configured to cover an upper torso of the subject to be imaged by the MRI system and the lower posterior RF coil array is configured to cover a lower torso of the subject.

In certain embodiments, the head and neck RF coil array is molded to conform to a back of a head and neck of the subject to be imaged by the MRI system, and the upper posterior RF coil array and lower posterior RF coil array are rectangular in shape. In certain embodiments, the one or more neck straps include a fourth plurality of RF coils, where each RF coil of each fourth plurality of RF coils includes two distributed capacitance wire conductors. In certain embodiments, each RF coil further includes a coupling electronics which includes: a decoupling circuit, an impedance inverter circuit, and a pre-amplifier, wherein the impedance inverter circuit has an impedance matching network and an input balun, the pre-amplifier includes a low input impedance pre-amplifier optimized for high source impedance, and the impedance matching network provides the high source impedance.

In certain embodiments, one or more grooves are formed in the compressible body to accommodate the first, second, and third pluralities of coils. In certain embodiment, the RF coil array assembly further includes one or more respiratory motion detection RF coils embedded in the compressible body and configured to detect respiratory motion of the subject. In certain embodiments, the compressible body is made of memory foam. In certain embodiments, the head and neck RF arrays further includes a head support section and a neck support section. In certain embodiments, the RF coil array assembly further includes an upper back support section. In certain embodiments, the head support section has a first sidewall and a second sidewall that curve upward to surround the head of the subject to by imaged by the MRI system.

Other embodiments provide for a pad for a MRI system. The pad includes: a compressible base layer configured to support a body of a subject to be imaged by the MRI system; a deformable head support on the base layer configured to confine a head of the subject; and a radio frequency (RF) coil array embedded within the base layer and configured to detect magnetic resonance (MR) signals of the subject. Each RF coil in the RF coil array includes two distributed capacitance wire conductors, wherein the RF coil array adapts its shape according to a load of the subject. In certain embodiments, the pad further includes one or more respiratory motion detection coils embedded in the compressible base layer and configured to detect respiratory motion of the subject. In certain embodiments, the deformable head support is made of a deformable gel that is moldable into and retains a desired shape. In certain embodiments, the pad further includes a cover layer attached to the top surface of the base layer and covering the head support. In certain embodiments, the head support is semi-ring shaped.

Yet still other embodiments provide for a pad for a MRI system. The pad includes: a compressible body including a central portion and two side portions each extending from the central portion at an angle; and a radio frequency (RF) coil array embedded in the central portion and configured to detect magnetic resonance (MR) signals of a subject to be imaged by the MRI system. Each RF coil in the RF coil array includes two distributed capacitance wire conductors, wherein the RF coil array adapts its shape according to a load of the subject. In certain embodiments, the central portion is configured to support a body of the subject and the two side portions are configured to confine the body. In certain embodiments, the compressible body is U-shaped. In certain embodiments, the pad further includes one or more respiratory motion detection coils embedded in the central portion and configured to detect respiratory motion of the subject.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention

What is claimed is:

1. A radio frequency (RF) coil array assembly for a magnetic resonance imaging (MRI) system, comprising:
   a compressible body;
   an upper posterior RF coil array comprising a first plurality of RF coils embedded in the compressible body;
   a lower posterior RF coil array comprising a second plurality of RF coils embedded in the compressible body; and
   a head and neck RF coil array removably coupled to the upper posterior RF coil array, the head and neck RF coil array comprising:
   a third plurality of RF coils embedded in the compressible body;

one or more neck straps integrated with the compressible body configured to fold over a neck of a subject to be imaged by the MRI system;

wherein each RF coil of the first plurality of RF coils, the second plurality of RF coils, and the third plurality of RF coils includes a distributed capacitance loop portion comprising two distributed capacitance wire conductors absent any discrete or lumped components.

2. The RF coil array assembly of claim 1, wherein the upper posterior RF coil array is configured to cover an upper torso of the subject to be imaged by the MRI system and the lower posterior RF coil array is configured to cover a lower torso of the subject.

3. The RF coil array assembly of claim 1, wherein the head and neck RF coil array is molded to conform to a back of a head and neck of the subject to be imaged by the MRI system, and the upper posterior RF coil array and lower posterior RF coil array are rectangular in shape.

4. The RF coil array assembly of claim 1, wherein the one or more neck straps include a fourth plurality of RF coils, where each RF coil of each fourth plurality of RF coils includes two distributed capacitance wire conductors.

5. The RF coil array assembly of claim 1, wherein each RF coil further comprises a coupling electronics which includes: a decoupling circuit, an impedance inverter circuit, and a pre-amplifier, wherein the impedance inverter circuit comprises an impedance matching network and an input balun, the pre-amplifier comprises a low input impedance pre-amplifier optimized for high source impedance, and the impedance matching network provides the high source impedance.

6. The RF coil array assembly of claim 1, wherein one or more grooves are formed in the compressible body to accommodate the first, second, and third pluralities of coils.

7. The RF coil array assembly of claim 1, further comprising one or more respiratory motion detection RF coils embedded in the compressible body and configured to detect respiratory motion of the subject.

8. The RF coil array assembly of claim 1, wherein the compressible body is made of memory foam.

9. The RF coil array assembly of claim 1, wherein the head and neck RF arrays further comprises a head support section and a neck support section.

10. The RF coil array assembly of claim 9, further comprising an upper back support section.

11. The RF coil array assembly of claim 9, wherein the head support section comprises a first sidewall and a second sidewall that curve upward to surround the head of the subject to by imaged by the MRI system.

12. A pad for a magnetic resonance imaging (MRI) system, the pad comprising:
a compressible base layer configured to support a body of a subject to be imaged by the MRI system;
a moldable head support on the base layer configured to conform to the contours of the body of the subject thereby confining a head of the subject; and
a radio frequency (RF) coil array embedded within the base layer and configured to detect magnetic resonance (MR) signals of the subject, each RF coil in the RF coil array including two distributed capacitance wire conductors absent any discrete or lumped components, wherein the RF coil array adapts its shape according to a load of the subject.

13. The pad of claim 12, further comprising one or more respiratory motion detection coils embedded in the compressible base layer and configured to detect respiratory motion of the subject.

14. The pad of claim 12, wherein the moldable head support is made of a moldable gel that is moldable into and retains a desired shape.

15. The pad of claim 12, further comprising a cover layer attached to the top surface of the base layer and covering the head support.

16. The pad of claim 12, wherein the head support is semi-ring shaped.

17. A pad for a magnetic resonance imaging (MRI) system, the pad comprising:
a compressible body including a central portion and two side portions each extending from the central portion at an angle; and
a radio frequency (RF) coil array embedded in the central portion and configured to detect magnetic resonance (MR) signals of a subject to be imaged by the MRI system, each RF coil in the RF coil array including two distributed capacitance wire conductors absent any discrete or lumped components, wherein the RF coil array adapts its shape according to a load of the subject.

18. The pad of claim 17, wherein the central portion is configured to support a body of the subject and the two side portions are configured to confine the body.

19. The pad of claim 17, wherein compressible body is U-shaped.

20. The pad of claim 17, wherein further comprising one or more respiratory motion detection coils embedded in the central portion and configured to detect respiratory motion of the subject.

21. The RF coil array assembly of claim 1, wherein the two distributed capacitance wire conductors are encapsulated and separated by a dielectric material, the two distributed capacitance wire conductors are maintained separate by the dielectric material along an entire length of the distributed capacitance loop portion.

22. The RF coil array assembly of claim 1, wherein the two distributed capacitance wire conductors include cuts, resulting in each conductor being formed of/by two segments.

23. The RF coil array assembly of claim 1, wherein the two distributed capacitance wire conductors include planar strips.

24. The pad of claim 17, wherein the RF coil array is further embedded in the two side portions.

* * * * *